United States Patent
Furutani et al.

(10) Patent No.: US 12,388,025 B2
(45) Date of Patent: Aug. 12, 2025

(54) WIRING SUBSTRATE

(71) Applicant: IBIDEN CO., LTD., Gifu (JP)

(72) Inventors: Toshiki Furutani, Ibi-gun (JP);
Masashi Kuwabara, Ibi-gun (JP)

(73) Assignee: IBIDEN CO., LTD., Ogaki (JP)

( * ) Notice: Subject to any disclaimer, the term of this patent is extended or adjusted under 35 U.S.C. 154(b) by 119 days.

(21) Appl. No.: 18/351,520

(22) Filed: Jul. 13, 2023

(65) Prior Publication Data

US 2024/0021532 A1   Jan. 18, 2024

(30) Foreign Application Priority Data

Jul. 14, 2022 (JP) ................. 2022-113452

(51) Int. Cl.
*H01L 23/538* (2006.01)
*H01L 21/48* (2006.01)

(52) U.S. Cl.
CPC ...... *H01L 23/5386* (2013.01); *H01L 21/4857* (2013.01); *H01L 23/5383* (2013.01)

(58) Field of Classification Search
CPC ............. H01L 23/5386; H01L 23/5383; H01L 21/4857
USPC ........................................................ 174/253
See application file for complete search history.

(56) References Cited

U.S. PATENT DOCUMENTS

2015/0068790 A1 * 3/2015 Kim .................... H05K 1/0274
174/253
2016/0064329 A1 * 3/2016 Lee ..................... H01L 23/5386
257/659

FOREIGN PATENT DOCUMENTS

JP       2014-078634 A     5/2014

* cited by examiner

*Primary Examiner* — Andargie M Aychillhum
(74) *Attorney, Agent, or Firm* — Finnegan, Henderson, Farabow, Garrett & Dunner, LLP

(57) ABSTRACT

A wiring substrate includes insulating layers, conductor layers formed on the insulating layers, and via conductors formed in the insulating layers such that the via conductors are connecting the conductor layers through the insulating layers. The conductor layers include a first conductor layer and the outermost conductor layer formed such that the outermost conductor layer includes first conductor pads positioned to mount a first component and second conductor pads positioned to mount a second component and that the first conductor layer includes wiring patterns including first wiring patterns connecting the first conductor pads and second conductor pads, and the first conductor layer in the conductor layers is formed such that the wiring patterns have the minimum wiring width of 3 µm or less, the minimum inter-wiring distance of 3 µm or less and an aspect ratio in the range of 2.0 to 4.0.

20 Claims, 11 Drawing Sheets

WIRING SUBSTRATE

CROSS-REFERENCE TO RELATED APPLICATIONS

The present application is based upon and claims the benefit of priority to Japanese Patent Application No. 2022-113452, filed Jul. 14, 2022, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2014-78634 describes a printed wiring board including laminated multiple resin insulating layers, conductor layers that are respectively formed on the multiple resin insulating layers, and via conductors connecting the conductor layers. The entire contents of this publication are incorporated herein by reference.

SUMMARY OF THE INVENTION

According to one aspect of the present invention, a wiring substrate includes insulating layers, conductor layers formed on the insulating layers, and via conductors formed in the insulating layers such that the via conductors are connecting the conductor layers through the insulating layers. The conductor layers include a first conductor layer and the outermost conductor layer formed such that the outermost conductor layer includes first conductor pads positioned to mount a first component and second conductor pads positioned to mount a second component and that the first conductor layer includes wiring patterns including first wiring patterns connecting the first conductor pads and the second conductor pads, and the first conductor layer in the conductor layers is formed such that the wiring patterns have the minimum wiring width of 3 μm or less, the minimum inter-wiring distance of 3 μm or less and an aspect ratio in the range of 2.0 to 4.0.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
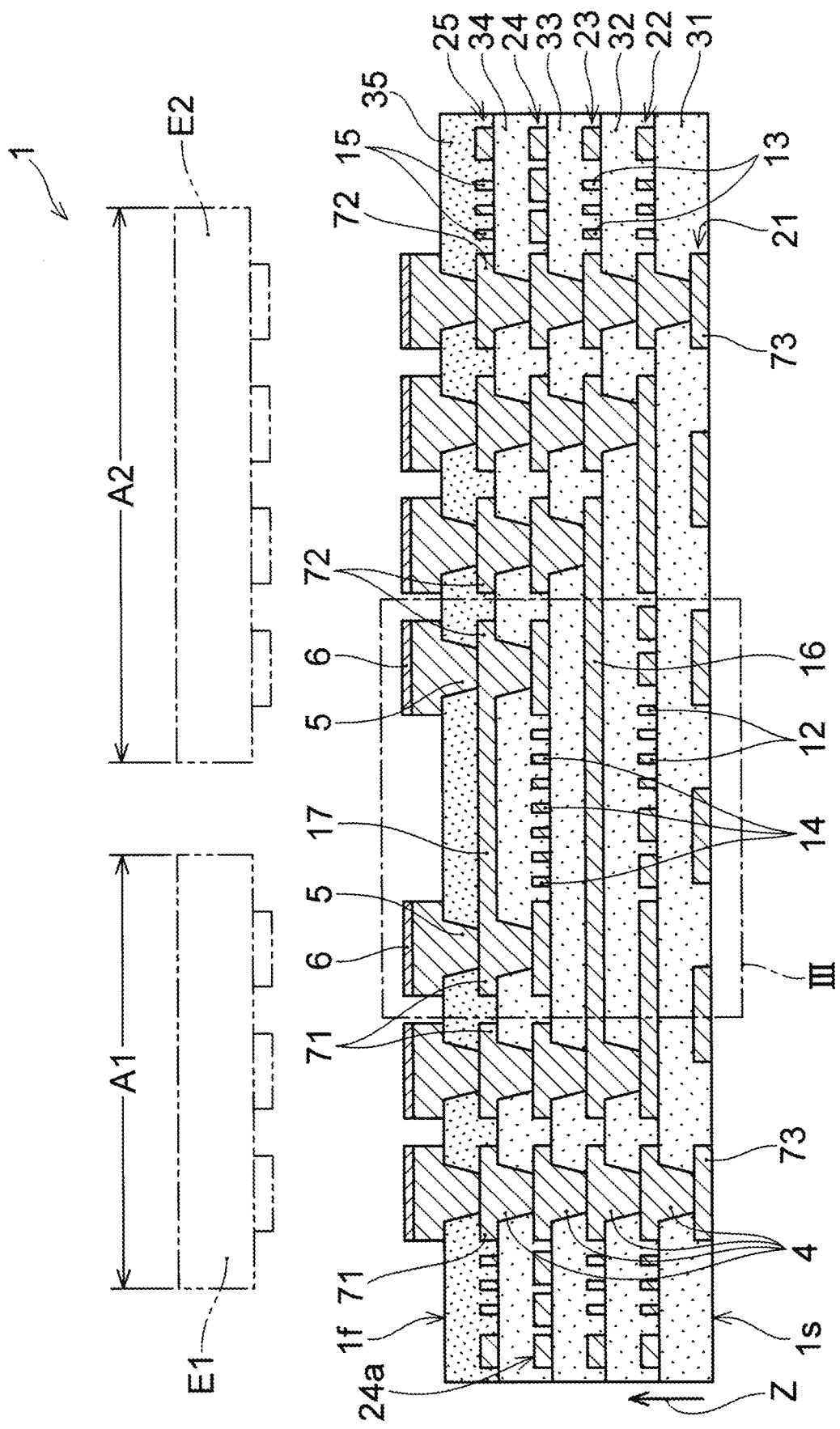
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

First Embodiment

Figure 2:
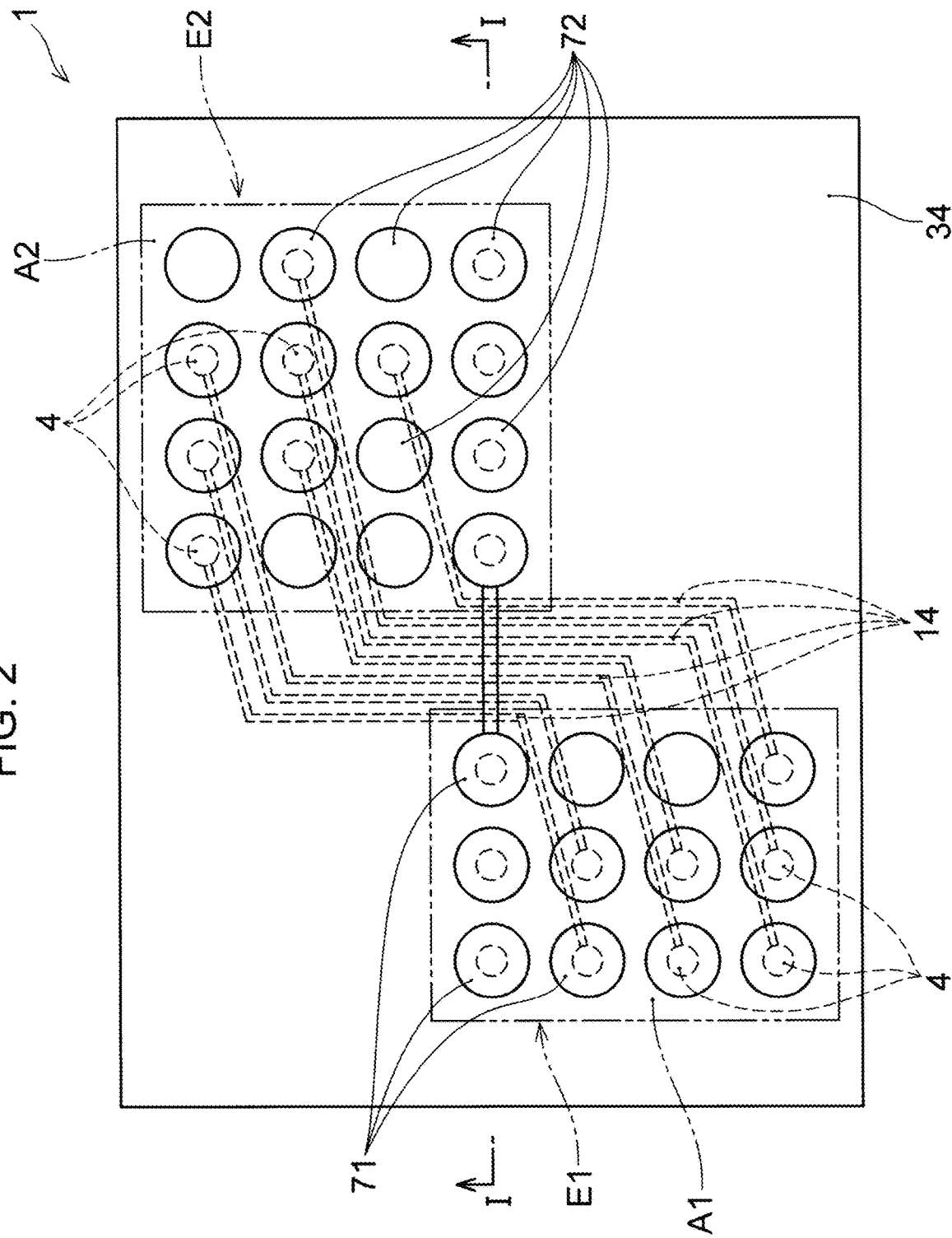
FIG. 2 is a plan view of the wiring substrate of FIG. 1.
Figure 3:
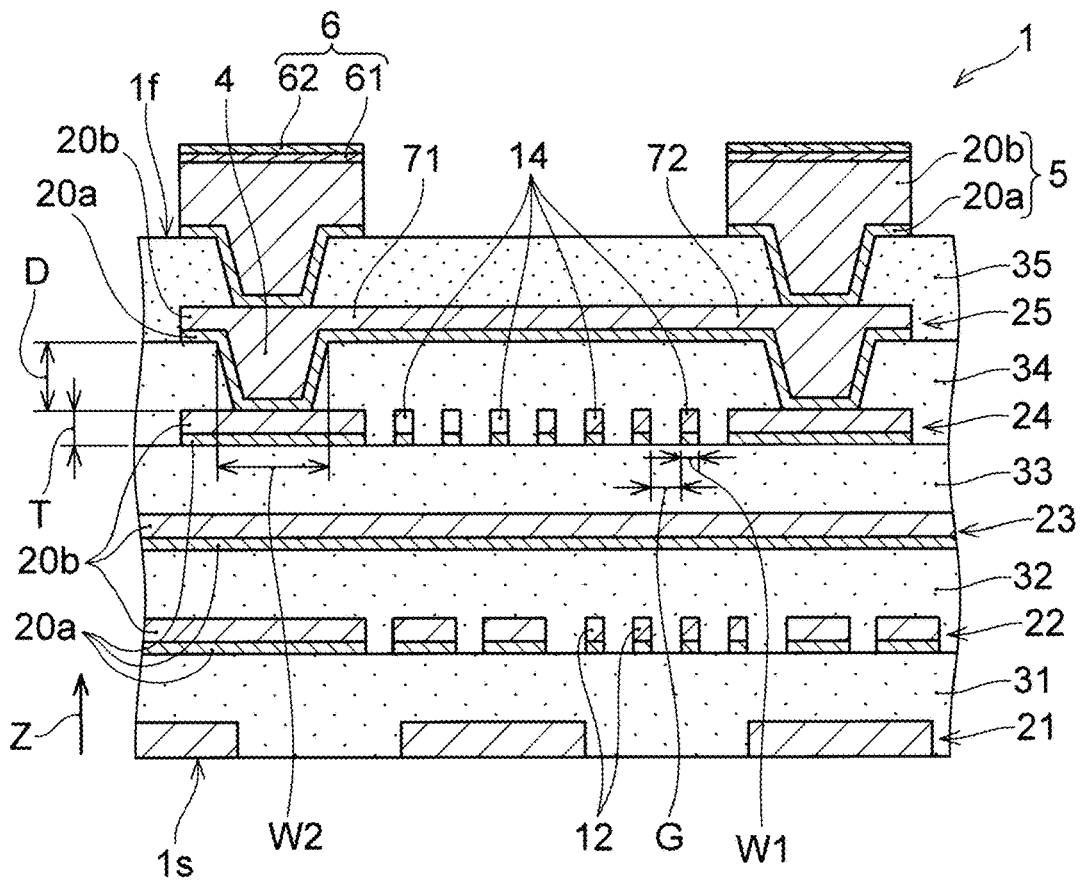
FIG. 3 is an enlarged view of a portion (III) of FIG. 1.

A wiring substrate according to a first embodiment of the present invention is described with reference to the drawings. FIG. 1 illustrates a cross-sectional view of a wiring substrate 1, which is an example of the wiring substrate of the present embodiment. FIG. 2 illustrates an example of the wiring substrate 1 in a plan view, and FIG. 3 illustrates an enlarged view of a portion (III) of FIG. 1. The term "plan view" means viewing an object along a thickness direction of the wiring substrate 1. The wiring substrate 1 is merely an example of the wiring substrate of the embodiment. For example, a laminated structure of the wiring substrate of the embodiment, and the number of conductor layers and the number of insulating layers included in the wiring substrate of the embodiment are not limited to the laminated structure of the wiring substrate 1 of FIG. 1, and the number of conductor layers and the number of insulating layers included in the wiring substrate 1. Further, in the drawings to be referenced in the following description, in order to facilitate understanding of an embodiment to be disclosed, a specific portion may be depicted in an enlarged manner and it may be possible that structural elements are not depicted in precise proportions in terms of size or length relative to each other.

As illustrated in FIG. 1, the wiring substrate 1 has a first surface (1f), which is one of two surfaces (main surfaces) orthogonal to a thickness direction of the wiring substrate 1, and a second surface (1s) on the opposite side with respect to the first surface (1f). The wiring substrate 1 includes alternately laminated multiple conductor layers and multiple insulating layers. Specifically, the wiring substrate 1 illustrated in FIG. 1 includes alternately laminated conductor layers (21-25) and insulating layers (31-35). The wiring substrate 1 in the example of FIG. 1 is a so-called build-up wiring substrate manufactured by sequentially forming the conductor layers (21-25) and the insulating layers (31-35).

Among the conductor layers (21-25), the conductor layer 21 is formed on an outermost side on the second surface (1s) side of the wiring substrate 1. Surfaces of the conductor layer 21 other than a surface on the second surface (1s) side are covered by the insulating layer 31. Then, on a surface of the insulating layer 31 on the first surface (1f) side, in an order toward the first surface (1f), the conductor layer 22, the insulating layer 32, the conductor layer 23, the insulating layer 33, the conductor layer 24, the insulating layer 34, the conductor layer 25, and the insulating layer 35 are formed. The conductor layer 25 is an outermost conductor layer on the first surface (1f) side of the wiring substrate 1. The first surface (1f) of the wiring substrate 1 is mainly formed of a surface of the insulating layer 35, which covers the conductor layer 25, the surface facing the opposite direction with respect to the conductor layer 25. On the other hand, the second surface (1s) of the wiring substrate 1 is formed of surfaces of the conductor layer 21 and the insulating layer 31, the surfaces facing the opposite direction with respect to the conductor layer 22.

In the description of the embodiment, in the thickness direction (lamination direction) of the wiring substrate 1, the first surface (1f) side is also referred to as an "upper side" or "upper," and the second surface (1s) side is also referred to as a "lower side" or "lower." Further, for the conductor layers and the insulating layers, a surface facing the first surface (1f) side is also referred to as an "upper surface," and a surface facing the second surface (1s) side is also referred to as a "lower surface." The thickness direction of the wiring substrate of the embodiment is also referred to as a "Z direction."

The wiring substrate 1 of the embodiment further includes via conductors 4 that connect the conductor layers (21-25) by each penetrating one of the insulating layers (31-34). The wiring substrate 1 in FIG. 1 includes the multiple via conductors 4 that each penetrate one of the insulating layers (31-34). The via conductors 4 penetrating the insulating layer 31 connect the conductor layer 21 and the conductor layer 22, the via conductors 4 penetrating the insulating layer 32 connect the conductor layer 22 and the conductor layer 23, the via conductors 4 penetrating the insulating layer 33 connect the conductor layer 23 and the conductor layer 24, and the via conductors 4 penetrating the insulating layer 34 connect the conductor layer 24 and the conductor layer 25. Each of the via conductors 4 is integrally formed with a conductor layer formed on an upper side of the each of the via conductors. The via conductors 4 each have a tapered shape that is reduced in width from the first surface (1f) side toward the second surface (1s) side of the wiring substrate 1. The "width" of each of the via conductors 4 is a longest distance between two points on an outer perimeter of a cross section (or an end surface) of the each of the via conductors 4 that is orthogonal to the Z direction.

The conductor layers (21-25) each include predetermined conductor patterns. In the example of FIG. 1, the conductor layer 25, which is the outermost conductor layer on the first surface (1f) side, includes multiple conductor pads 71 and multiple conductor pads 72, which are connected to components (a first component (E1) and a second component (E2) in the example of FIGS. 1 and 2) mounted on the wiring substrate 1 when the wiring substrate 1 is used. The conductor pads 71 are conductor pads (first conductor pads) on which the first component (E1) is mounted, and the conductor pads 72 are conductor pads (second conductor pads) on which the second component (E2), which is a separate component from the first component (E1), is mounted. The term "separate component" means that the first component (E1) and the second component (E2) are separate components, and do not necessarily mean that the first component (E1) and the second component (E2) are of different types. The first component (E1) and the second component (E2) may be of the same type or may have different functions. The first component (E1) and the second component (E2) mounted on the wiring substrate 1 can be electronic components such as semiconductor integrated circuit devices such as microcomputers and memories.

The first surface (1f) of the wiring substrate 1, on which the first component (E1) and the second component (E2) are mounted, has a component mounting region (A1), which is a region where the first component (E1) is positioned, and a component mounting region (A2), which is a region where the second component (E2) is positioned. In the example of FIGS. 1 and 2, the multiple conductor pads 71 are all provided in the component mounting region (A1), and the multiple conductor pads 72 are all provided in the component mounting region (A2). In FIG. 2, depiction of the structural elements above the insulating layer 34 is omitted and only the conductor pads 71 and the conductor pads 72 are illustrated.

The wiring substrate 1 of FIG. 1 further includes multiple conductor posts 5 formed on surfaces of the conductor pads 71 or the conductor pads 72. The conductor posts 5 penetrate the insulating layer 35 and protrude from the upper surface of the insulating layer 35, which forms the first surface (1f) of the wiring substrate 1. On the upper surface of the insulating layer 35, no conductor layer is formed and there are no conductors other than the conductor posts 5. By the conductor posts 5, the components (the first component (E1) and the second component (E2) in the example of FIG. 1) mounted on the wiring substrate 1 are connected to the conductor pads 71 or the conductor pads 72. Since the first component (E1) and the second component (E2) are connected to the wiring substrate 1 via the conductor posts 5, it may be possible that the mounting of the components is facilitated and a short circuit between the conductor pads 71 or a short circuit between the conductor pads 72 is prevented.

On end surfaces of the conductor posts 5 on the opposite side with respect to the conductor layer 25, a functional layer 6 is formed that can function as a protective layer of the end surfaces of the conductor posts 5 and/or a bonding layer between the first component (E1) or the second component (E2) and the conductor posts 5. The functional layer 6 is formed of, for example, a plating film of nickel, tin, palladium, gold, or the like.

The conductor layer 25 includes conductor patterns 17 and multiple wiring patterns in addition to the conductor pads 71 and the conductor pads 72. As illustrated in FIG. 1, the conductor patterns 17 connect the conductor pads 71 and the conductor pads 72. Although not illustrated, the wiring patterns 15 are signal lines that connect any conductor pads included in any of the conductor layers (21-25) to propagate electrical signals.

The conductor layer 24 includes multiple wiring patterns 14, the conductor layer 23 includes a conductor pattern 16 and multiple wiring patterns 13, and the conductor layer 22 includes multiple wiring patterns 12. Two ends of the conductor pattern 16 included in the conductor layer 23 are respectively connected to one conductor pad 71 and one conductor pad 72 via the via conductors 4. These conductor pad 71 and conductor pad 72 are connected to each other via the conductor pattern 16. Similar to the wiring patterns the multiple wiring patterns 14 included in the conductor layer 24, the multiple wiring patterns 13 included in the conductor layer 23, and the multiple wiring patterns 12 included in the conductor layer 22 are signal lines that each connect any conductor pads to propagate electrical signals.

On the other hand, in the example of FIG. 1, the conductor layer 21, which is the outermost conductor layer on the second surface (1s) side of the wiring substrate 1, includes conductor pads 73. The conductor pads 73 are conductor pads (third conductor pads) that are connected to external conductors (not illustrated) of the wiring substrate 1. The external conductors connected to the conductor pads 73 can be, for example, electrodes of an electronic component such as a semiconductor integrated circuit device similar to the first component (E1) and the second component (E2). Without being limited to a semiconductor integrated circuit device, the conductor pads 73 can be connected to electrodes of any electronic component, or pads of a wiring substrate other than the wiring substrate 1 such as a motherboard of an electronic device, or any conductive mechanism elements, or the like.

In the example of FIG. 1, the conductor pads 71 of the conductor layer 25 and the conductor pads 73 of the conductor layer 21 are connected via multiple stacked via conductors 4 (so-called stacked via conductors). Similarly, the conductor pads 72 and the conductor pads 73 are connected via multiple stacked via conductors 4. Therefore, the conductor pads 71 and the conductor pads 72 are connected to the conductor pads 73 via a substantially shortest distance. Therefore, when the wiring substrate 1 is used, the first component (E1) and the second component (E2) can be connected via a short path to a member, such as a motherboard, connected to the conductor pads 73. Therefore, it is thought that intended electrical characteristics can be easily obtained. Different from the example of FIG. 1, it is also possible that only the conductor pads 71 or only the conductor pads 72 are connected to the conductor pads 73 via the so-called stack via conductors, and it is also possible that none of the conductor pads (71, 72) are connected to the conductor pads 73.

In FIG. 2, the multiple wiring patterns 14 included in the conductor layer 24 are indicated using dashed lines. As illustrated in FIG. 2, each of the multiple wiring patterns 14 extends between directly below one of the multiple conductor pads 71 and directly below one of the multiple conductor pads 72. Then, each of two ends of each of the wiring patterns 14 is connected via a via conductor 4 to a conductor pad 71 or a conductor pad 72. That is, one of the multiple conductor pads 71 and one of the multiple conductor pads 72 are connected to each other via one of the wiring patterns 14.

In this way, the multiple conductor layers (the conductor layers (21-25) in the example of FIG. 1) included in the wiring substrate 1 of the embodiment include a conductor layer that includes wiring patterns connecting the conductor pads 71 and the conductor pads 72 (the conductor layer 24 that includes the wiring patterns 14 in the example of FIGS. 1 and 2). In the description of the embodiment, wiring patterns such as the wiring patterns 14 that connect first conductor pads such as the conductor pads 71 on which the first component (E1) is mounted and second conductor pads such as the conductor pads 72 on which the second component (E2) is mounted are also referred to as "first wiring patterns" for distinction from other wiring patterns. Further, a conductor layer such as the conductor layer 24 that includes the "first wiring patterns" is also referred to as a "first conductor layer" for distinction from other conductor layers.

As described above, the conductor pattern 16 and the conductor pattern 17 also connect the conductor pads 71 and the conductor pads 72. The conductor patterns (16, 17) can each be a so-called solid pattern that functions as a so-called ground plane or power plane or functions as a shield for the wiring patterns 14. However, it is also possible that the conductor patterns (16, 17) are each a wiring pattern that propagates electrical signals, similar to the wiring patterns 14. When the conductor patterns (16, 17) are wiring patterns, the conductor patterns (16, 17) also can be "first wiring patterns." The wiring patterns 12, the wiring patterns 13, and the wiring patterns 15 also may connect the conductor pads 71 and the conductor pads 72, and in this case, the wiring patterns (12, 13, also can be "first wiring patterns." Therefore, the conductor layers (22, 23, 25) also can each be a "first conductor layer." That is, the wiring substrate of the embodiment can include one or more "first conductor layers" that include the "first wiring patterns." Further, a "first conductor layer" can include one or more "first wiring patterns."

In the wiring substrate of the embodiment, a surface (24a) of a "first conductor layer" (such as the conductor layer 24 of the wiring substrate 1) on the first surface (1f) side is a polished surface in a state of having been polished. Therefore, the surface (24a) can have, for example, a surface roughness lower than that of a plating film formed as it is by metal deposition. Therefore, it is thought that, in the wiring patterns 14 and the like included in the conductor layer 24, deterioration of signal transmission characteristics or an increase in voltage drop due to a substantial increase in conductor resistance due to a skin effect seen in transmission of high-frequency signals is unlikely to occur. For example, the polished surface of a "first conductor layer" such as the conductor layer 24 on the first surface (1f) side can have an arithmetic mean roughness of 0.3 μm or less. When such a surface roughness is obtained, it may be possible that a favorable effect regarding transmission characteristics described above can be obtained.

Further, the surface (24a), which is a polished surface, is likely to have a uniform height (for example, a distance from the second surface (1s)) over the entire conductor layer 24. Therefore, the via conductors 4 formed on the conductor layer 24 are likely to be aligned in height, and the conductor posts 5 formed thereon also are likely to be aligned in height. As a result, it is thought that the first component (E1) and/or the second component (E2) can be stably mounted on the wiring substrate 1. Further, when the surface (24a) is a polished surface, each of the wiring patterns 14 and the like is likely to have a substantially constant thickness over its entire length, and thus, a characteristic impedance of each of the wiring patterns 14 is unlikely to fluctuate. Therefore, it may be possible that a reflection loss in the wiring patterns 14 is suppressed.

As illustrated in FIG. 3, the wiring patterns 14 included in the conductor layer 24 of the wiring substrate 1 have a wiring width (W1) and a distance (G) between adjacent wiring patterns 14. In the present embodiment, a "first conductor layer" such as the conductor layer 24 that includes wiring patterns such as the wiring patterns 14 connecting the conductor pads 71 and the conductor pads 72 include wiring patterns that are formed at a relatively fine pitch among the wiring patterns included in the wiring substrate of the embodiment. In the wiring substrate of the present embodiment, a minimum value of the wiring width (W1) of the wiring patterns included in a "first conductor layer" is 1 µm or more and 3 µm or less and a minimum value of the distance (G) between adjacent wiring patterns is 1 µm or more and 3 µm or less. That is, a "first conductor layer" includes wiring patterns that have a wiring width of 3 µm or less and a distance of 3 µm or less between adjacent wiring patterns. In the example of FIGS. 1-3, the wiring width (W1) of the wiring patterns 14, which are first wiring patterns, is 1 µm or more and 3 µm or less, and the distance (G) between adjacent wiring patterns 14 is 1 µm or more and 3 µm or less.

In the present embodiment, a "first conductor layer" such as the conductor layer 24 includes wiring patterns having such a fine minimum wiring width and a fine minimum inter-wiring distance, and in particular, the "first wiring patterns" such as the wiring patterns 14 have a fine minimum wiring width and a fine minimum inter-wiring distance. Therefore, it is thought that the first component (E1) and the second component (E2) are connected by multiple signal lines with small occupation areas. Therefore, it may be possible that the wiring substrate 1 of the embodiment can be realized smaller than a conventional wiring substrate. Further, in designing the wiring substrate of the embodiment having wiring patterns with such fine wiring width and inter-wiring distance between the conductor pads to be connected to components, it may be possible that a degree of freedom in positioning two components is high.

In addition, in the present embodiment, "first wiring patterns" such as the wiring patterns 14, which can have such a fine wiring width, have a thickness (T) greater than the wiring width (W1). Therefore, in the present embodiment, the first wiring patterns have a relatively large aspect ratio ((thickness (T) of the first wiring patterns)/(width (W1) of the first wiring patterns)). Specifically, the "first wiring patterns" such as the wiring patterns 14 have an aspect ratio of 2.0 or more and 4.0 or less. The first wiring patterns having such an aspect ratio can have a low conductor resistance for a small wiring width. Therefore, it is thought that the wiring patterns 14 connecting the conductor pads 71 and the conductor pads 72 have low insertion loss. Therefore, it may be possible that signals can be propagated with little transmission loss between the first component (E1) and the second component (E2), that is, good transmission efficiency can be obtained. Further, it may be possible that in the signal lines connecting the first component (E1) and the second component (E2), a desired characteristic impedance can be obtained easier and insertion loss can be reduced.

In the example of FIGS. 1-3, the thickness (T) of the wiring patterns 14, which are first wiring patterns, that is, the thickness of the conductor layer 24, which is a first conductor layer, can be 4 µm or more and 7 µm or less. When such a thickness is obtained, it may be possible that an effect such as the reduction in insertion loss as described above can be obtained without significantly increasing the thickness of the wiring substrate of the embodiment.

As described above, in the present embodiment, the conductor layers (22-25) each can include wiring patterns formed at a relatively fine pitch similar to the wiring patterns 14. Therefore, it may be possible that via conductors 4 formed at a small pitch, that is, via conductors 4 each with a small width, are preferable. From this point of view, it may be possible that via conductors 4 with a large aspect ratio are preferable. In the wiring substrate 1 of the embodiment, the via conductors 4 can have an aspect ratio of, for example, 0.5 or more and 1.0 or less. It may be possible that wiring patterns such as the wiring patterns 14 formed at a fine pitch can be connected to wiring patterns of a conductor layer different from the conductor layer including the wiring patterns formed at a fine pitch, while maintaining a relatively fine pitch even at connection parts between the conductor layers. The aspect ratio of the via conductors 4 is (distance (D) in the Z direction between two conductor layers connected by a via conductor 4)/(width (W2) of the via conductor 4 at an interface with the conductor layer on the first surface (1f) side) illustrated in FIG. 3.

As described above, in the wiring substrate 1, the conductor layers (22, 23, 25) also can be "first conductor layers." Therefore, for each of all the multiple conductor layers included in the wiring substrate 1 of the embodiment except for the outermost conductor layer on the second surface (1s) side (the conductor layer 21 in the example of FIGS. 1-3), the surface on the first surface (1f) side may be a polished surface. It may be possible that for each of the conductor layers, an effect such as good transmission characteristics as described above can be obtained. Further, as described above, the conductor layers (22, 23, 25) also can include "first wiring patterns" similar to the wiring patterns 14 of the conductor layer 24. Therefore, all the multiple conductor layers included in the wiring substrate 1 of the embodiment except for the outermost conductor layer on the second surface (1s) side may include wiring patterns having a wiring width of 1 µm or more and 3 µm or less and an aspect ratio of 2.0 or more and 4.0 or less. Further, all the conductor layers except for the outermost conductor layer on the second surface (1s) side may include wiring patterns having a distance of 1 µm or more and 3 µm or less between adjacent wiring patterns. It may be possible that wiring patterns with small insertion loss can be obtained in the conductor layers, and in addition, the wiring substrate of the embodiment can be designed with a higher degree of freedom, and can be realized in a smaller size than a conventional wiring substrate.

The insulating layers (31-34) are each an interlayer insulating layer interposed between two conductor layers and can each be formed using an insulating resin. Examples of the insulating resin include: thermosetting resins such as epoxy resins, bismaleimide triazine resins (BT resins), or phenolic resins; and thermoplastic resins such as fluorine resins, liquid crystal polymers (LCP), fluoroethylene (PTFE) resins, polyester (PE) resins, and modified polyimide (MPI) resins. The insulating layers (31-34) can each contain an inorganic filler (not illustrated) such as silica, or alumina. The insulating layers (31-34) may each also contain a reinforcing material (core material) such as a glass fiber (not illustrated). However, from a point of view of facilitating formation of wiring patterns formed at a fine pitch, it may be preferable that a reinforcing material is not contained.

When the insulating layers (31-34) each contain an inorganic filler, it is thought that an inorganic filler having small particle sizes (a particle size of an inorganic filler particle is a longest distance between two points on a surface of the inorganic filler particle) is preferable. For example, the insulating layers (31-34) can each contain multiple inorganic filler particles having a maximum particle size of 1 μm or less. When the particle sizes of the inorganic filler contained in each of the insulating layers are small, for example, even between wiring patterns formed at a fine pitch, such as the wiring patterns 14, it may be possible that a short circuit due to a leak path or the like along an inorganic filler particle is unlikely to occur. Further, it may facilitate formation of fine via conductors 4 or formation of wiring patterns of an embodiment illustrated in FIG. 7 and the like to be referenced later.

Further, in order to obtain good high-frequency signal transmission characteristics in the wiring patterns included in each of the conductor layers (21-25) included in the wiring substrate 1, insulating layers (31-34) having low dielectric constant and dielectric loss are preferred For example, for each of the insulating layer (31-34), a relative permittivity is about 3.0 or more and 4.0 or less and a dielectric loss tangent is about 0.001 or more and 0.005 or less at a frequency of 5.8 GHz.

The insulating layer 35 covering the conductor layer 25 can also be formed using the same insulating resin as the insulating layers (31-34). However, the insulating layer 35 forming the first surface (1f) of the wiring substrate 1 may be an insulating layer functioning as a solder resist. In that case, the insulating layer 35 may be formed of a material of which a main component or an additive is different from that of the insulating layers (31-34). For example, the insulating layer 35 may be formed using an epoxy resin or polyimide resin or the like containing a photosensitive agent.

The conductor layers (21-25), the via conductors 4, and the conductor posts 5 are formed, for example, using any metal such as copper or nickel. The conductor layers (21-25), the via conductors 4, and the conductor posts 5 are each depicted in a simplified manner as having only one layer in FIG. 1, but may each have a multilayer structure including two or more metal films formed by plating or sputtering or the like as illustrated in FIG. 3, which is an enlarged view.

In the example of FIG. 3, the conductor layer 21 is formed of, for example, a single-layer metal film formed of an electrolytic plating film. The conductor layer 21 is embedded in the insulating layer 31 and only a surface thereof on the second surface (1s) side is exposed. On the other hand, the conductor layers (22-25) and the conductor posts each include a first layer (20a) and a second layer (20b) formed on the first layer (20a), and each have a two-layer structure formed of these two layers of metal films. The second layer (20b) is formed entirely on the first layer (20a), that is, on the first surface (1f) side of the wiring substrate 1. A surface of the second layer (20b) on the first surface (1f) side is a polished surface that each of the conductor layers (22-25) described above can have.

The first layer (20a) is formed of, for example, a metal film such as an electroless plating film or a sputtering film. The second layer (20b) is formed of, for example, a metal film formed by plating or the like. The second layer (20b) may be a metal film formed by electrolytic plating using the first layer (20a) as a power feeding layer. The first layer (20a) is interposed between the second layer (20b) and the insulating layer on a lower side of the respective conductor layer. When the first layer (20a) is formed of a sputtering film, it may be possible that strong adhesion of the conductor layers (22-25) and the conductor posts 5 with respect to the insulating layers (31-35) can be obtained. Further, it may be possible that the conductor layers (22-25) and the conductor posts 5 each have a highly flat upper surface.

As illustrated in FIG. 3, the functional layer 6 also can have a multilayer structure. In the example of FIG. 3, the functional layer 6 includes a lower layer 61, which is directly formed on end surfaces (upper surfaces) of the conductor posts 5 on the opposite side with respect to the conductor layer 25, and an upper layer 62, which is formed on the lower layer 61. The upper layer 62 is formed of, for example, tin, palladium, gold, or an alloy thereof. The upper layer 62 functions as a protective film for the conductor posts 5, and/or as a bonding material between the conductor posts 5 and the first component (E1) or the second component (E2) (see FIG. 1). The lower layer 61 is formed of, for example, a metal with suitable properties, such as nickel, and can function as a barrier film between the upper layer 62 and the conductor posts 5 and/or a film for strengthening adhesion between the two.

Figure 4:
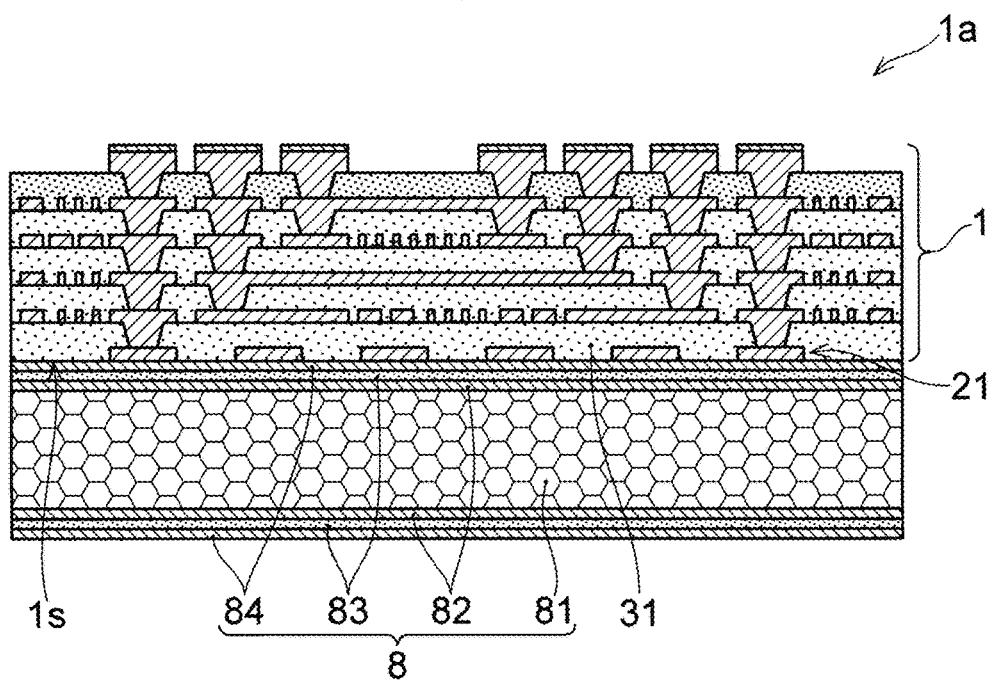
FIG. 4 is a cross-sectional view illustrating a modified embodiment of a wiring substrate according to an embodiment of the present invention.

FIG. 4 illustrates a wiring substrate (1a), which is a modified example of the wiring substrate 1 of the present embodiment. FIG. 4 is a cross-sectional view of the wiring substrate (1a) at the same place as the cross-sectional view of the wiring substrate 1 illustrated in FIG. 1. As illustrated in FIG. 4, the wiring substrate (1a) includes a support 8 in addition to the wiring substrate 1 in the example of FIG. 1. The wiring substrate (1a) in the example of FIG. 4 has the same structure as the wiring substrate 1 in the example of FIG. 1, except that the support 8 is provided. Therefore, in FIG. 4, the same reference numeral symbols as those in FIG. 1 are attached to structural elements common to the structural elements of the wiring substrate 1 of FIG. 1 already described or are omitted as appropriate, and description of these structural elements is omitted.

As illustrated in FIG. 4, the support 8 is attached to the second surface (1s) of the wiring substrate 1 in the example of FIG. 1. In other words, the wiring substrate 1 is formed on a surface of the support 8. The support 8 in the example of FIG. 4 includes a base material 81, a first metal film layer 82 laminated on each of both sides of the base material 81, a release layer 83 formed on the first metal film layer 82, and a second metal film layer 84 laminated on the release layer 83.

The base material 81 is formed of, for example, an inorganic material such as glass or silicon having appropriate rigidity, or an organic material such as an epoxy resin with which a reinforcing material such as glass fiber is impregnated. The first and second metal film layers (82, 84) can each be formed of any metal such as copper or a copper/titanium alloy. The release layer 83 is formed of any material that allows the first metal film layer 82 and the second metal film layer 84 to adhere to each other under a predetermined condition, and then, allows the adhered first metal film layer 82 and second metal film layer 84 to be separated from each other by being subjected to a specific treatment. For example, a material that softens or becomes brittle or loses its adhesiveness by being subjected to a specific treatment is used for the release layer 83. The release layer 83 can be formed of, for example, a thermoplastic adhesive that softens when heated, or a photosensitive adhesive that degrades when exposed to ultraviolet rays. The insulating layer 31 and the second metal film layer 84 are adhered, for example, by the adhesiveness of the insulating layer 31 itself when the insulating layer 31 is formed, and the conductor layer 21 and the second metal film layer 84 are adhered by metal-to-metal bonding when the conductor layer 21 is formed, for example, by plating.

The support 8 has a higher rigidity than the wiring substrate 1. Therefore, the wiring substrate 1 is supported by the support 8. Therefore, components such as the first component (E1) and the second component (E2) (see FIG. 1) can be stably mounted on the wiring substrate (1a) of the example of FIG. 4. Further, sealing of mounted components with a resin or the like can be easily performed. It is thought that, for example, a highly integrated and compact semiconductor integrated circuit device such as a multi-chip package device that includes the wiring substrate 1 can be easily manufactured. After component mounting or after sealing, the first metal film layer 82 and the second metal film layer 84 are separated from each other with the release layer 83 as a boundary, for example, through an appropriate treatment such as heating or ultraviolet irradiation described above. The second metal film layer 84 remaining on the wiring substrate 1 side may be removed, for example, by etching or the like. The support 8 illustrated in FIG. 4 is merely one example of a support that the wiring substrate (1a) of the present embodiment can include. A member of any material, structure and shape capable of supporting the wiring substrate 1 can be used as the support 8.

Next, with reference to FIGS. 5A-5K, an example of a method for manufacturing the wiring substrate of the present embodiment is described using a case where the wiring substrate 1 illustrated in FIG. 1 is manufactured as an example. Unless there is a description different from the description provided above regarding the materials of the structural elements of the wiring substrate 1, the structural elements can be formed using any of the materials described above with respect to the structural elements.

Figure 5A:
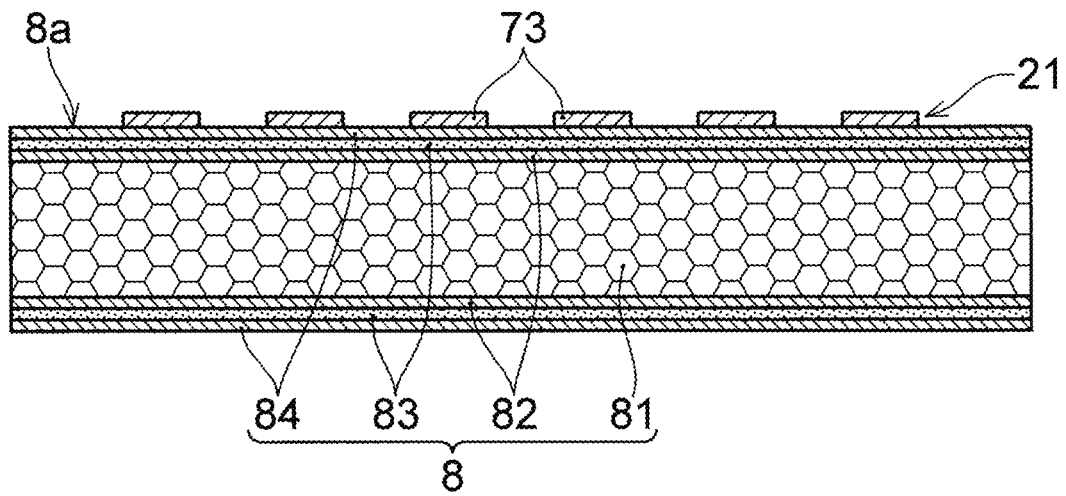
FIG. 5A is a cross-sectional view illustrating an example of a manufacturing process of a wiring substrate according to an embodiment of the present invention.

As illustrated in FIG. 5A, the support 8 is prepared, and the conductor layer 21 is formed on a surface (8a) of the support 8. In the example illustrated in FIG. 5A, the support 8 illustrated in FIG. 4 referenced above is prepared. That is, in the example of FIG. 5A, as described above, the support 8 including the base material 81, the first metal film layer 82, the release layer 83, and the second metal film layer 84 is prepared.

The conductor layer 21 is formed, for example, by pattern plating using electrolytic plating. On the second metal film layer 84, which forms the surface (8a) of the support 8, a plating resist (not illustrated) is provided having openings corresponding to the formation positions of the conductor patterns such as the conductor pads 73 to be included in the conductor layer 21. Then, by electrolytic plating using the second metal film layer 84 as a power feeding layer, a metal such as copper is deposited in the openings of the plating resist, and the conductor layer 21 is formed including conductor patterns formed of the deposited metal. After that, the plating resist is removed. Before the removal of the plating resist, the upper surface of the conductor layer 21 (the surface on the opposite side with respect to the support 8) may be polished, for example, using any method such as chemical mechanical polishing (CMP). It may be possible that even in the conductor layer 21, good transmission characteristics as described above can be obtained. When the polishing is performed, an upper surface portion of the plating resist before removal may be polished together with the upper surface of the conductor layer 21.

Figure 5B:
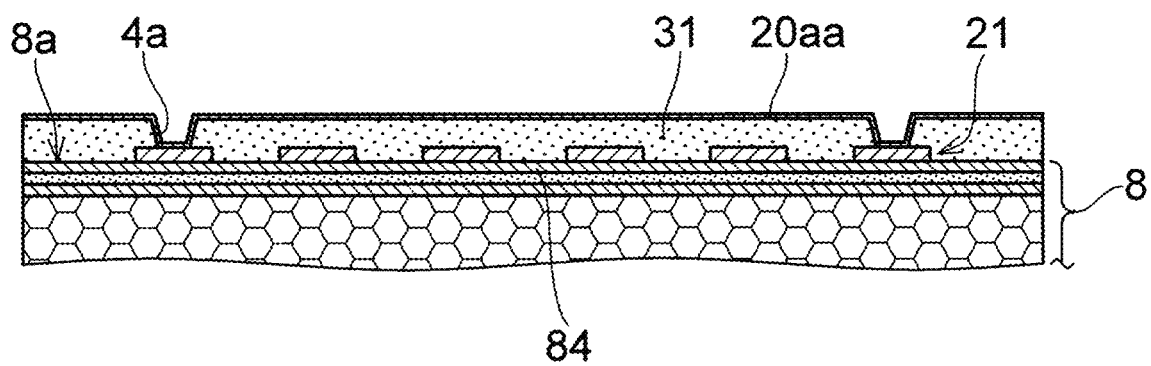
FIG. 5B is a cross-sectional view illustrating an example of a manufacturing process of a wiring substrate according to an embodiment of the present invention.

As illustrated in FIG. 5B, the insulating layer 31 covering the conductor layer 21 is formed on the second metal film layer 84. The insulating layer 31 is formed, for example, by laminating and thermocompression bonding a film-like epoxy resin on the second metal film layer 84 and the conductor layer 21. As described above, the insulating layer 31 (and the insulating layers (32-34) to be formed in subsequent processes (see FIG. 5F)) can be formed using a thermosetting resin such as a BT resin or a phenolic resin, or a thermoplastic resin such as a fluorine resin or LCP, in addition to an epoxy resin. In FIG. 5B, and in FIGS. 5C-5K to be referenced below, depiction of the opposite side with respect to the surface (8a) side of the support 8 is omitted. However, also on the opposite side with respect to the surface (8a) side of the support 8, the conductor layer 21 may be formed in the process illustrated in FIG. 5A, and processing or formation of structural elements described with reference to FIGS. 5B-5K may be performed.

Through holes (4a) are formed in the insulating layer 31 at formation positions of the via conductors 4 (see FIG. 1) by irradiating $CO_2$ laser or the like. After the formation of the through holes (4a), preferably, a desmear treatment is performed in which resin residues (smears) remaining in the through holes (4a) are removed. The desmear treatment may be a wet treatment including immersion in a chemical such as a permanganate solution. However, for example, the desmear treatment may also be a dry treatment such as a plasma treatment using a plasma gas such as argon, methane tetrafluoride, a mixture of methane tetrafluoride and oxygen, or sulfur hexafluoride. For example, it may be possible that a desmear treatment such as a plasma treatment suppresses erosion of the surface of the insulating layer 31 compared to a wet treatment.

Then, in the through holes (4a) and on the entire surface of the insulating layer 31, a metal film (20aa) formed of, for example, copper or nickel or the like is formed by, for example, sputtering or electroless plating. When the metal film (20aa) is formed by sputtering, it may be possible that the metal film (20aa) exhibiting high adhesion to the insulating layer 31 is formed. A part of the metal film (20aa) can be the first layer (20a) of the conductor layer 22 formed on the insulating layer 31 (see FIG. 3).

Figure 5C:
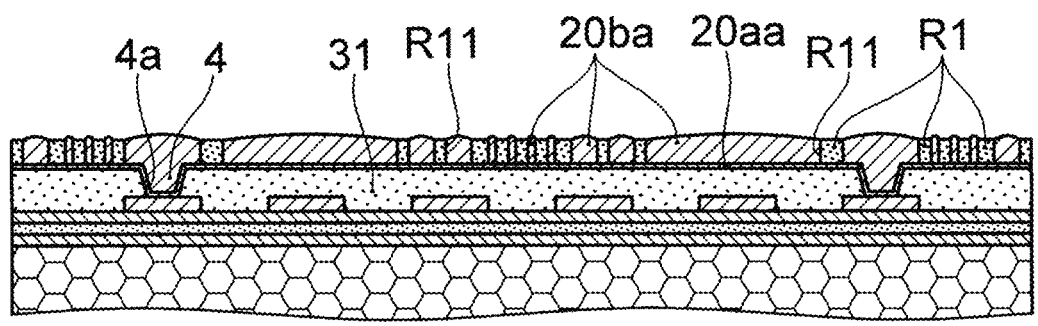
FIG. 5C is a cross-sectional view illustrating an example of a manufacturing process of a wiring substrate according to an embodiment of the present invention.

As illustrated in FIG. 5C, a plating resist (R1) having openings (R11) is provided on the metal film (20aa). The plating resist (R1) is formed, for example, by laminating a dry film resist onto the metal film (20aa), and the openings (R11) are formed, for example, using a photolithography technology. The openings (R11) are formed in patterns corresponding to the conductor patterns to be included in the conductor layer 22 (see FIG. 3) formed on the insulating layer 31.

The conductor patterns such as the wiring patterns 12 (see FIG. 3) included in the conductor layer 22 may have a wiring width of 3 μm or less, as described above. The openings (R11) are formed to have an opening width corresponding to the wiring width of the conductor patterns such as the wiring patterns 12 to be formed in the openings (R11). Further, as described above, the wiring patterns of the conductor layer 22 may have an aspect ratio of 2.0 or more and 4.0 or less. Therefore, in the method illustrated in FIG. 5C, preferably, the plating resist (R1) is formed having a thickness (height) equal to or greater than the thickness (height) of the wiring patterns that satisfies the aspect ratio of the wiring patterns to be formed.

A metal film (20ba) formed of, for example, copper or nickel or the like is formed in the openings (R11) of the plating resist (R1) by electrolytic plating using the metal film (20aa) as a power feeding layer. A part of the metal film (20ba) can be the first layer (20a) of the conductor layer 22 formed on the insulating layer 31 (see FIG. 3). The via conductors 4 are formed in the through holes (4a) of the insulating layer 31. As in the example in FIG. 5C, the metal film (20ba) may be formed to entirely fill the openings (R11) and further have a curved upper surface protruding upward from the upper surface of the plating resist (R1). It may be possible that conductor patterns with desired thickness and aspect ratio can be more reliably formed.

Figure 5D:
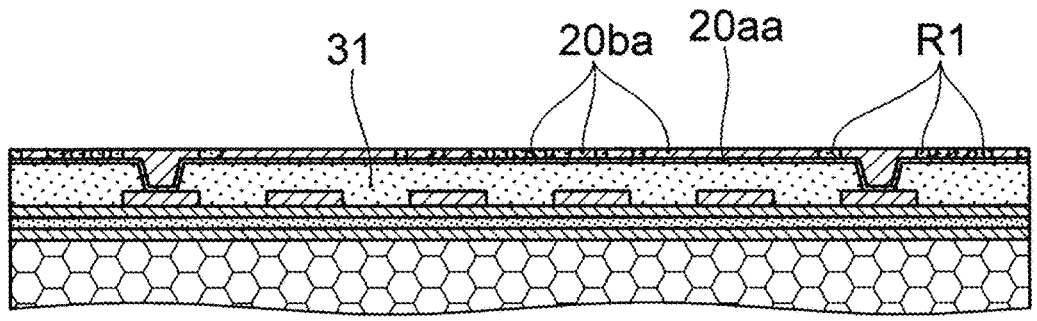
FIG. 5D is a cross-sectional view illustrating an example of a manufacturing process of a wiring substrate according to an embodiment of the present invention.

As illustrated in FIG. 5D, an upper-side portion of the metal film (20ba) is removed by polishing. At least a portion of the metal film (20ba) protruding from the upper surface of the plating resist (R1) is removed. The metal film (20ba) is polished until a total thickness of the metal film (20aa) and the metal film (20ba) reaches a thickness required for the conductor layer 22 (see FIG. 5E) formed on the insulating layer 31, for example, a thickness of 7 μm or less. As in the example of FIG. 5D, an upper-side portion of the plating resist (R1) may also be removed along with the portion of the metal film (20ba). The polishing of the metal film (20ba) is performed, for example, using any method such as CMP. As a result of the polishing, the upper surface of the metal film (20ba) can have an arithmetic mean roughness of 0.3 μm or less.

After the polishing the metal film (20ba), the plating resist (R1) is removed. Further, a portion of the metal film (20aa) that is not covered by the metal film (20ba) is removed, for example, by quick etching or the like.

Figure 5E:
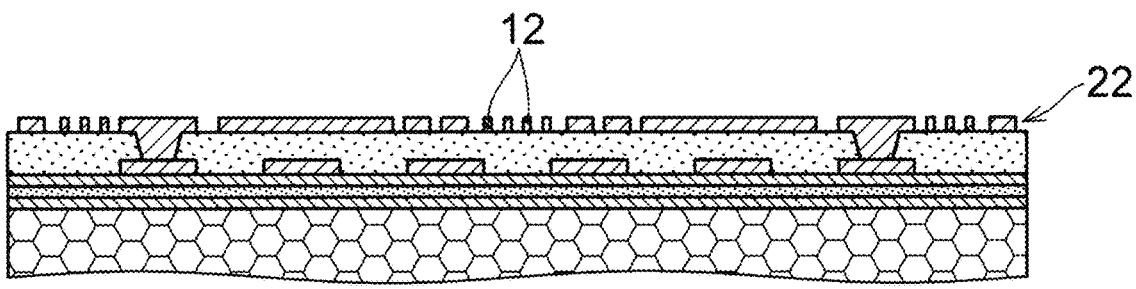
FIG. 5E is a cross-sectional view illustrating an example of a manufacturing process of a wiring substrate according to an embodiment of the present invention.

As a result, as illustrated in FIG. 5E, the conductor layer 22 including predetermined conductor patterns, such as the wiring patterns 12, separated from each other is obtained. In FIG. 5E, similar to FIG. 1, the conductor layer 22 is illustrated as having only one layer. However, the conductor layer 22 is formed of the metal film (20ba) illustrated in FIG. 5D and the metal film (20aa) after a portion thereof is removed from the state of FIG. 5D as described above.

Figure 5F:
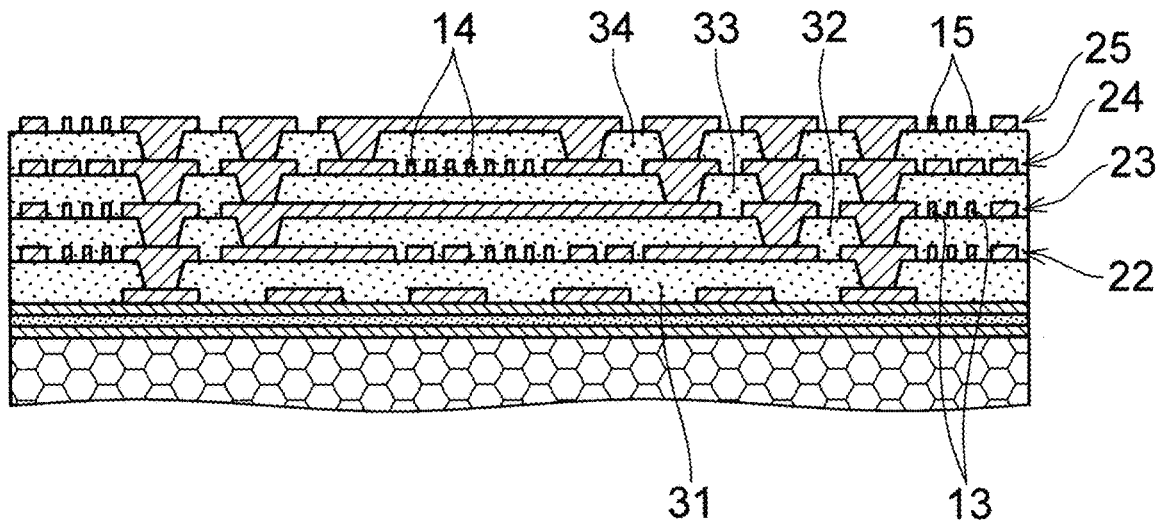
FIG. 5F is a cross-sectional view illustrating an example of a manufacturing process of a wiring substrate according to an embodiment of the present invention.

As illustrated in FIG. 5F, on the insulating layer 31 and the conductor layer 22, the Insulating layers (32-34) and the conductor layers (23-25) are alternately formed. The insulating layers (32-34) may each be formed, for example, using the same method as the method for forming the insulating layer 31. Further, the conductor layers (23-25) may each be formed, for example, using the same method as the method for forming the conductor layer 22. The conductor layers (23-25) are respectively formed using plating resists, such as the plating resist (R1) (see FIG. 5C) for the conductor layer 22, having openings corresponding to the conductor patterns, such as the wiring patterns (13-15), to be included in the conductor layers.

Figure 5G:
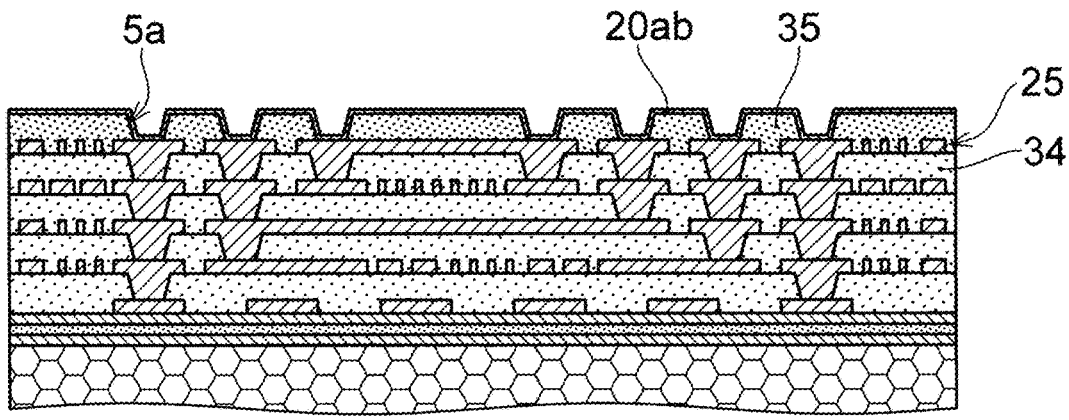
FIG. 5G is a cross-sectional view illustrating an example of a manufacturing process of a wiring substrate according to an embodiment of the present invention.
Figure 5H:
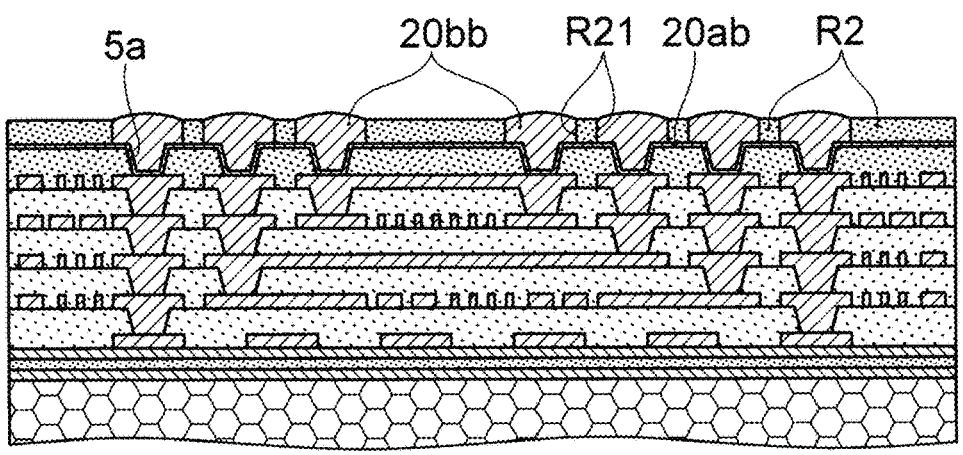
FIG. 5H is a cross-sectional view illustrating an example of a manufacturing process of a wiring substrate according to an embodiment of the present invention.
Figure 5I:
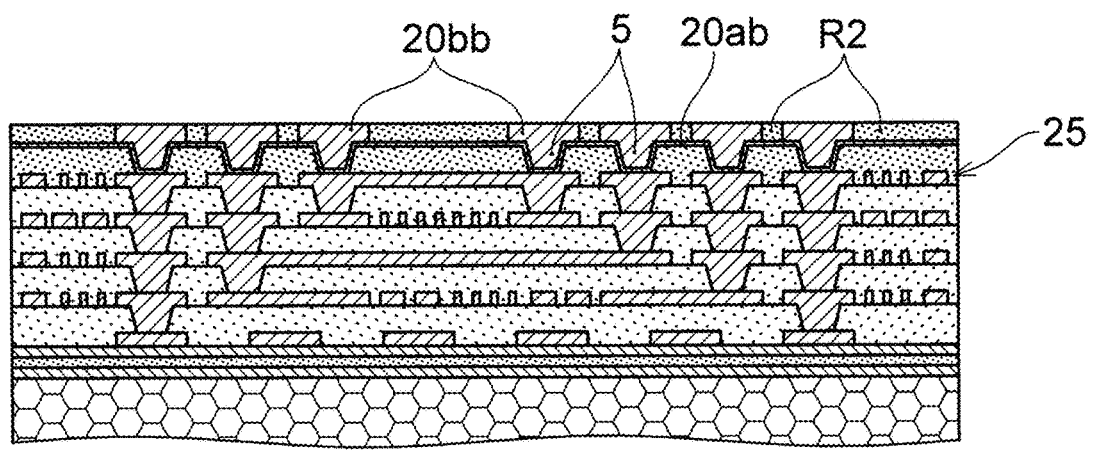
FIG. 5I is a cross-sectional view illustrating an example of a manufacturing process of a wiring substrate according to an embodiment of the present invention.

As illustrated in FIGS. 5G-5I, the conductor posts 5 (see FIG. 5I) are formed. The conductor posts 5 may be formed, for example, using a general method for forming a conductor layer, such as a semi-additive method. However, FIGS. 5G-5I illustrate a method including polishing similar to the method for forming the conductor layer 22 described above. That is, first, as illustrated in FIG. 5G, the insulating layer 35 is formed on the conductor layer 25 and the insulating layer 34. Similar to the formation of the insulating layer 31, the insulating layer 35 is formed, for example, by thermocompression bonding of a film-like epoxy resin. When the insulating layer 35 is an insulating layer functioning as a solder resist as described above, the insulating layer 35 may be formed using a method different from the insulating layers (31-34), such as spraying or curtain coating using an epoxy resin or polyimide resin containing a photosensitizer.

Through holes (5a) are formed in the formed insulating layer 35, for example, by $CO_2$ laser irradiation or photolithography. The through holes (5a) are formed at positions where the conductor posts 5 (see FIG. 5I) are to be formed. After the formation of the through holes (5a), a desmear treatment such as a plasma treatment may be performed. Then, in the through holes (5a) and on the entire surface of the insulating layer 35, a metal film (20ab) formed of, for example, copper or nickel or the like is formed by, for example, sputtering or electroless plating.

As illustrated in FIG. 5H, a plating resist (R2) is formed on the metal film (20ab), for example, by laminating a dry film resist. Openings (R21) corresponding to the conductor posts 5 are formed in the plating resist (R2) by photolithography or the like. Then, in the openings (R21) and in the through holes (5a) exposed in the openings (R21), a metal such as copper or nickel is deposited by electrolytic plating using the metal film (20ab) as a power feeding layer, and a metal film (20bb) formed of the deposited metal is formed. The openings (R21) and the through holes (5a) are filled with the metal film (20bb). As in the example in FIG. 5H, the metal film (20bb) may be formed to have a curved upper surface protruding upward from the upper surface of the plating resist (R2).

As illustrated in FIG. 5I, an upper-side portion of the metal film (20bb) is removed, for example, by CMP. An upper-side portion of the plating resist (R2) may also be removed along with the portion of the metal film (20bb). The metal film (20bb) is polished until a height from the upper surface of the conductor layer 25 to the upper surface of the metal film (20bb) reaches a predetermined height required for the conductor posts 5. As a result, the conductor posts 5 are formed that are formed of a part of the metal film (20ab) and the metal film (20bb) after polishing and have a predetermined height. The metal films (20ab, 20bb) can respectively be the first layer (20a) and the second layer (20b) of the conductor posts 5 (see FIG. 3).

Figure 5J:
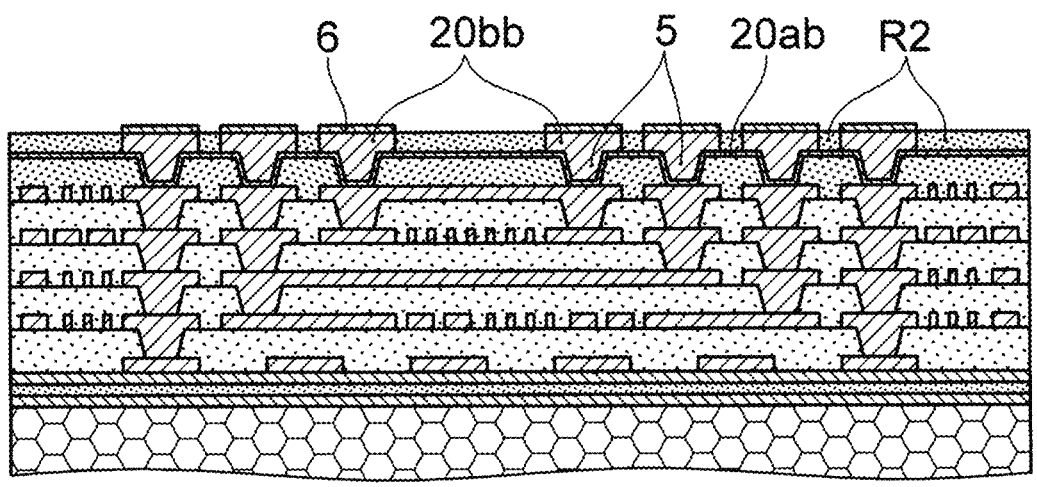
FIG. 5J is a cross-sectional view illustrating an example of a manufacturing process of a wiring substrate according to an embodiment of the present invention.

As illustrated in FIG. 5J, the functional layer 6 is formed on the conductor posts 5, for example, by electrolytic plating using the metal film (20ab) as a power feeding layer. For example, a metal film of one or more layers formed of nickel, tin, palladium, gold, or the like is formed as the functional layer 6. After that, the plating resist (R2) is removed, and a portion of the metal film (20ab) that is not covered by the metal film (20bb) is removed, for example, by quick etching. The conductor posts 5 that are electrically separated from each other are obtained.

Figure 5K:
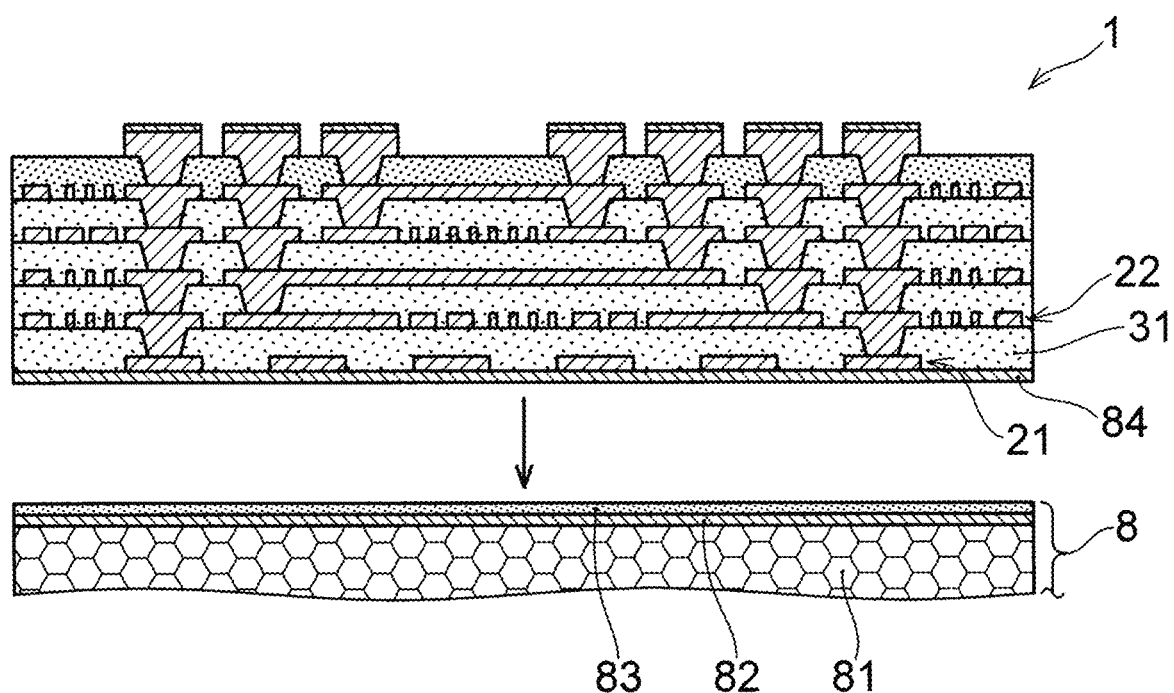
FIG. 5K is a cross-sectional view illustrating an example of a manufacturing process of a wiring substrate according to an embodiment of the present invention.

As illustrated in FIG. 5K, the support 8 is removed. For example, in a state in which the adhesiveness of the release layer 83 provided in the support 8 is lost or the release layer 83 itself is softened due to heating or ultraviolet irradiation or the like, the base material 81 and the first metal film layer 82 are pulled apart from the second metal film layer 84. After that, the second metal film layer 84 is removed by etching or the like. The surfaces of the conductor layer 21 and the insulating layer 31 on the opposite side with respect to the conductor layer 22 are exposed. Through the above processes, the wiring substrate 1 in the example of FIG. 1 is completed.

When the wiring substrate (1a) illustrated in FIG. 4 is manufactured, from the state illustrated in FIG. 5J, the plating resist (R2) is removed, and after that, through the processes up to removing the portion of the metal film (20ab) that is not covered by the metal film (20bb), the wiring substrate (1a) is completed.

Figure 6:
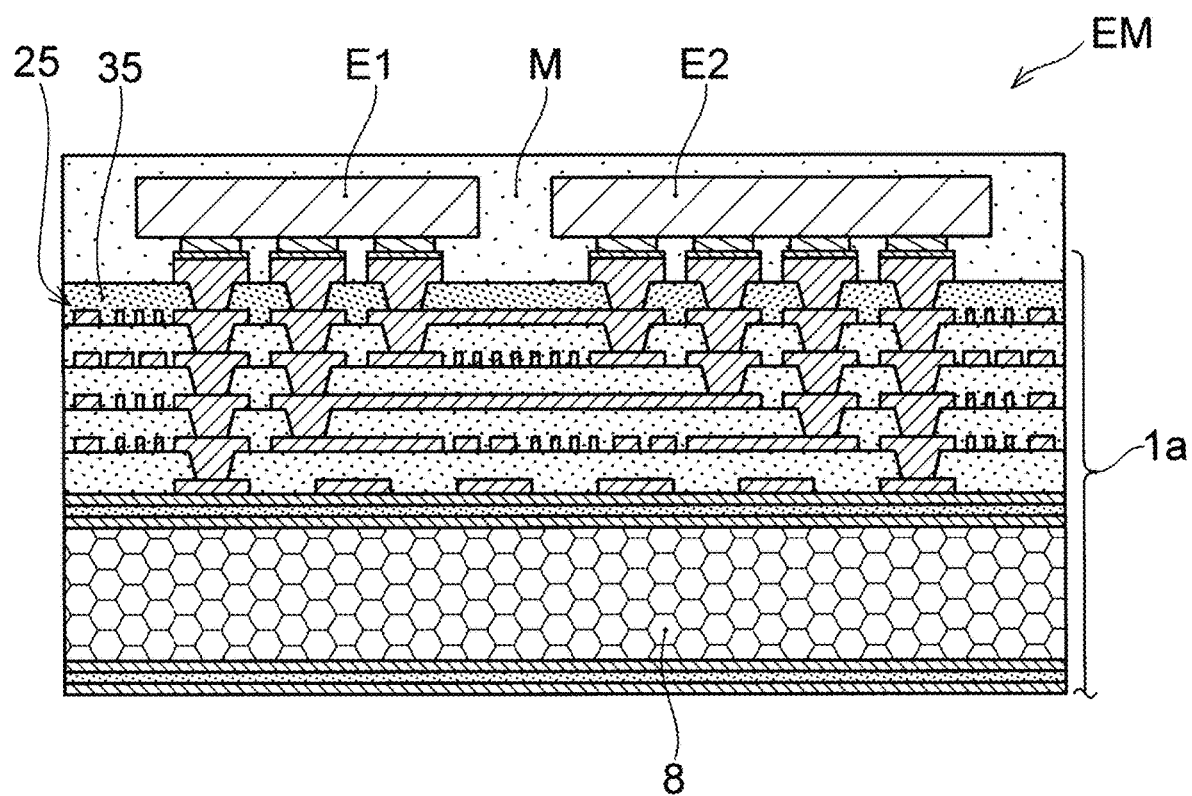
FIG. 6 is a cross-sectional view illustrating an example of a method for manufacturing an electronic component using a wiring substrate according to an embodiment of the present invention.

FIG. 6 illustrates an example of a state in a manufacturing process of an electronic component (a multi-chip package device) using the wiring substrate (1a) illustrated in FIG. 4. As illustrated in FIG. 6, in a manufacturing process of a multi-chip package device (EM), the first component (E1) and the second component (E2), which are microcomputers, memories, or the like, are mounted on the wiring substrate (1a) by a reflow treatment, flip-chip bonding, or the like. That is, the first component (E1) and the second component (E2) are mounted on the wiring substrate (1a) with the support 8 still provided. Since the conductor layers such as the conductor layer 25 and the insulating layers such as the insulating layer 35 are supported by the support 8, the first component (E1) and the second component (E2) can be mounted in a stable state. Therefore, it is thought that the first component (E1) and the second component (E2) can be connected to the wiring substrate (1a) with good quality and high reliability.

In the example of FIG. 6, the first component (E1) and the second component (E2) are further sealed with a mold resin (M) containing an epoxy resin. The first component (E1) and the second component (E2) are sealed, for example, by transfer molding or compression molding. This sealing process can also be performed in the state in which the wiring substrate (1a) is provided with the support 8. Therefore, it is thought that handling of the wiring substrate (1a) with the components already mounted during the sealing process is easy, and the first component (E1) and the second component (E2) are sealed in a stable state with little movement of the wiring substrate (1a) in a molding machine. Therefore, it is thought that a defect related to the resin sealing is less likely to occur.

Second Embodiment

Figure 7:
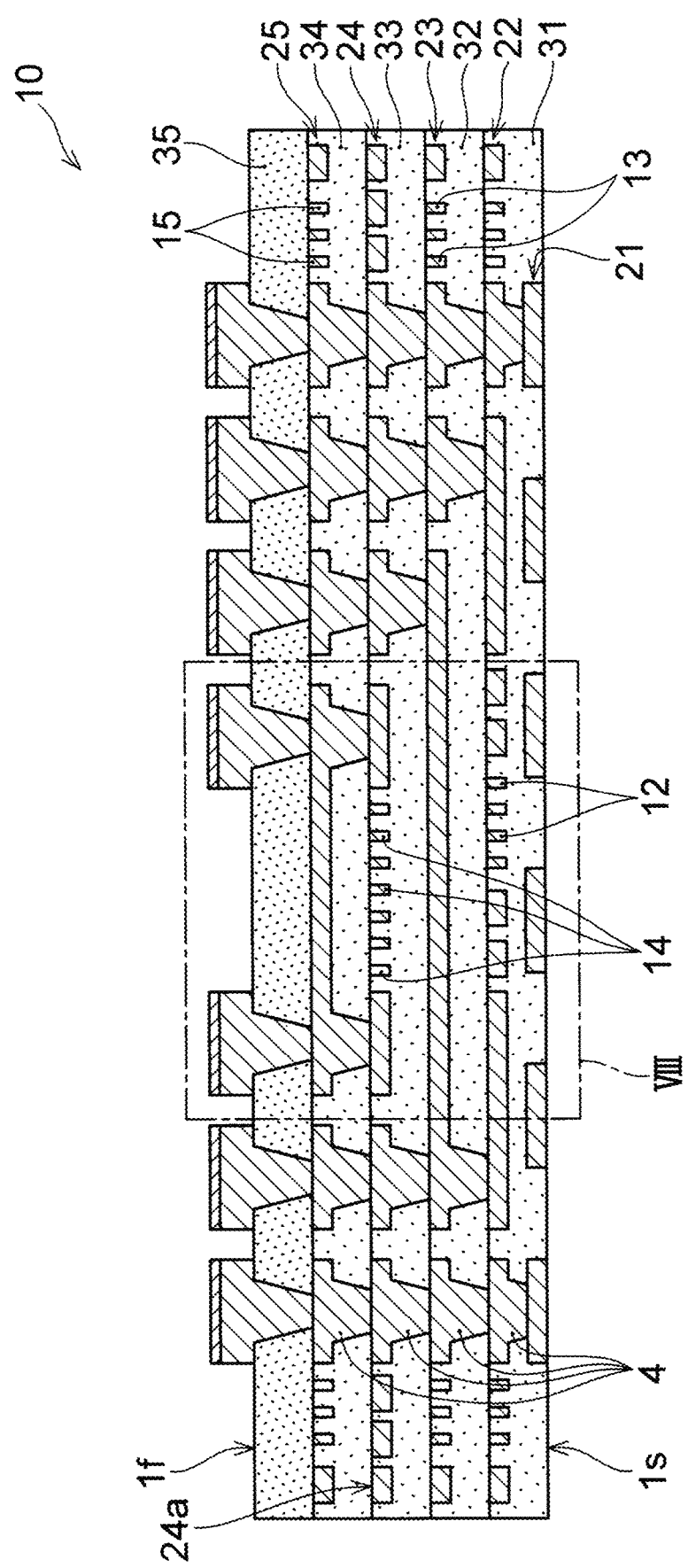
FIG. 7 is a cross-sectional view illustrating a wiring substrate according to another embodiment of the present invention.
Figure 8:
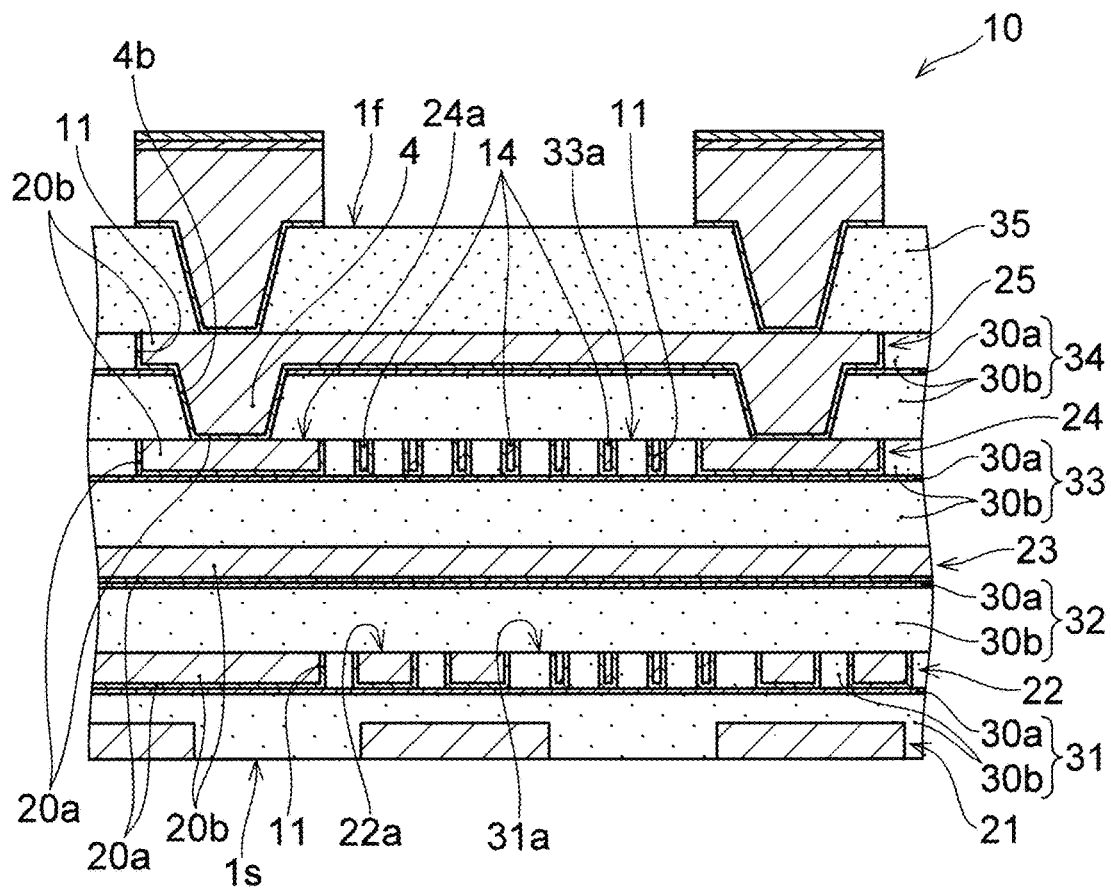
FIG. 8 is an enlarged view of a portion (VIII) of FIG. 7.

Next, a wiring substrate according to a second embodiment of the present invention is described with reference to FIGS. 7 and 8. FIG. 7 illustrates a cross-sectional view of a wiring substrate 10, which is an example of the wiring substrate of the second embodiment, and FIG. 8 illustrates an enlarged view of a portion (VIII) of FIG. 7. The wiring substrate 10 differs from the wiring substrate 1 of the first embodiment illustrated in FIG. 1 and the like mainly in the structures of the conductor layers (22-25). In the following, the differences between the wiring substrate 10 and the wiring substrate 1 are mainly described, and descriptions about structures or materials used that are the same as those of the wiring substrate 1 are omitted.

As illustrated in FIG. 7, in the wiring substrate 10, all the conductor layers (22-25) are respectively embedded in the insulating layers (31-34), which are respectively in contact with the lower sides (that is, on the second surface (1s) side of the wiring substrate of the conductor layers (22-25). The conductor layer 22 is embedded near the upper surface (surface on the first surface (1f) side of the wiring substrate 10) of the insulating layer 31, and the upper surface (surface on the first surface (1f) side) of the conductor layer 22 is exposed on the upper surface of the insulating layer 31. Similarly, the conductor layers (23-25) are respectively embedded near the upper surfaces (surfaces on the first surface (1f) side) of the insulating layers (32-34), and the upper surfaces (surfaces on the first surface (1f) side) of the conductor layers (23-25) are respectively exposed on the upper surfaces of the insulating layers (32-34).

Also in the wiring substrate 10 of the present embodiment, similar to the wiring substrate 1 illustrated in FIGS. 1 and 2, the conductor layer 25, which is the outermost conductor layer on the first surface (1f) side, includes the conductor pads 71 and the conductor pads 72 on which the first component (E1) and the second component (E2) (see FIG. 1) are respectively mounted. Although not illustrated, also in the wiring substrate 10, similar to the wiring substrate 1 illustrated in FIG. 1 and the like, the wiring patterns 14 included in the conductor layer 24 connect the conductor pads 71 and the conductor pads 72 via the via conductors 4. That is, also in the wiring substrate 10, the wiring patterns 14 are "first wiring patterns" described above, and the conductor layer 24 is a "first conductor layer" described above.

And, also in the wiring substrate 10, a minimum wiring width of the wiring patterns included in the conductor layer 24, which is a "first conductor layer," (for example, the wiring width of the wiring patterns 14, which are "first wiring patterns") is 1 μm or more and 3 μm or less. Further, a minimum distance between the wiring patterns included in the conductor layer 24 (for example, the distance between the wiring patterns 14) is 1 μm or more and 3 μm or less, and the aspect ratio of the wiring patterns 14 is 2.0 or more and 4.0 or less. Further, in the present embodiment, the surfaces of all the conductor layers (22-25) on the first surface (1f) side of the wiring substrate 10, including the surface (24a) of the conductor layer 24, are polished surfaces. In the wiring substrate 10, the wiring patterns (12, 13, 15) included in the conductor layers (22, 23, 25) may connect the conductor pads 71 and the conductor pads 72. Therefore, the conductor layers (22, 23, 25) may each be a "first conductor layer," and the wiring patterns (12, 13, may each be a "first wiring pattern."

As illustrated in FIG. 8, each of the insulating layers (31-34) has recesses 11 on a surface thereof on the first surface (1f) side of the wiring substrate 10. For example, the insulating layer 31 has recesses 11 on a surface (31a) thereof, and the insulating layer 33 has recesses 11 on a surface (33a) thereof. The via conductors 4 are formed in through holes (4b) that penetrate the insulating layers and are communicated and connected to the recesses 11. On the other hand, the conductor layers (22-25) are respectively formed of conductors filling the recesses 11 of the insulating layers. That is, the conductor layer 22 is formed in the recesses 11 of the insulating layer 31, and similarly, the conductor layers (23-25) are respectively formed in the recesses 11 of the insulating layers (32-34). In the conductor layers having such a structure, it is thought that conductor residues are unlikely to exist between the conductor patterns such as the wiring patterns 14, and thus, a short circuit failure is unlikely to occur. Then, it may be possible that wiring patterns formed at an even finer pitch can be realized.

Similar to the wiring substrate 1 of FIGS. 1-3, the conductor layers (22-25) are each formed of a first layer (20a), which is, for example, a sputtering film, and a second layer (20b), which is, for example, an electrolytic plating film formed on the first layer (20a). Then, in the wiring substrate 10, the first layer (20a) is formed along a bottom surface and a wall surface of each of the recesses 11. That is, in the conductor patterns such as the wiring patterns 14 of the conductor layers (22-25), the first layer (20a) covers a lower surface and a side surface of the second layer (20b). The first layer (20a) is interposed between the second layer (20b) and the insulating layer in which the respective conductor layer is embedded.

As described above, the surfaces (upper surfaces) of the conductor layers (22-25) on the first surface (1f) side of the wiring substrate 10 are polished surfaces. The surfaces of the insulating layers (31-34) on the first surface (1f) side may also be polished surfaces. The surfaces of the conductor layers (22-25) on the first surface (1f) side, which are polished surfaces, are respectively exposed on the surfaces of the insulating layers (31-35) on the first surface (1f) side. Further, the surfaces of the conductor layers (22-25) on the first surface (1f) side are respectively substantially flush with the surfaces of the insulating layers (31-34) on the first surface (1f) side. For example, the surface (22a) of the conductor layer 22 is exposed on the surface (31a) of the insulating layer 31, and the surface (22a) and the surface (31a) are substantially flush with each other, and the surface (24a) of the conductor layer 24 is exposed on the surface (33a) of the insulating layer 33, and the surface (24a) and the surface (33a) are substantially flush with each other. In this way, since the exposed surfaces (polished surfaces) of the conductor layers (22-25) are respectively flush with the surfaces of the insulating layers in which the conductor layers are respectively embedded, it is thought that high flatness can be obtained for the first surface (1f) of the wiring substrate 10, which is a laminate of these conductor layers and insulating layers. It is thought that components such as the first component (E1) and the second component (E2) (see FIG. 1) can be stably mounted on the wiring substrate 10.

Although omitted in FIG. 7, in the present embodiment, as illustrated in FIG. 8, the insulating layers (31-34) may each include a barrier layer (30a). A surface of the barrier layer (30a) on the first surface (1f) side of the wiring substrate 10 is in contact with the bottom surfaces of the recesses 11, that is, the surface of each of the conductor layers (22-25) on the second surface (1s) side of the wiring substrate 10. The insulating layers (31-34) in the example of FIG. 8 are each formed of the barrier layer (30a) and a main body layer (30b) that forms a portion on an upper side and a portion on a lower side of the barrier layer (30a). The main body layer (30b) is formed of a thermosetting resin such as an epoxy resin, which is exemplified as a material of the insulating layers of the wiring substrate 1 of FIG. 1, and various thermoplastic resins.

On the other hand, the barrier layer (30a) is formed of a material that has a higher resistance to a processing means used to form the recesses 11 in the insulating layers than the material of the main body layer (30b). For example, when the recesses 11 are formed by laser processing in which excimer laser is irradiated, the barrier layer (30a) can be formed of silicon oxide or silicon nitride. When such a barrier layer (30a) is included in each of the insulating layers (31-35), it may be possible that the formation of the recesses 11 having a desired depth is facilitated. It is also possible that the barrier layer (30a) is not included in each of the insulating layers in the present embodiment. For example, the recesses 11 having a desired depth can be formed by adjusting a processing condition, such as laser power, in the formation of the recesses 11.

When the insulating layers (31-34) that each include the barrier layer (30a) illustrated in FIG. 8 are formed, in the formation of the insulating layer 31 and the like described above, lamination and thermocompression bonding of a film-like resin are performed twice, and a barrier layer (30a) is formed therebetween. That is, by performing lamination and thermocompression bonding of a film-like resin for the first time, the main body layer (30b) is formed on the lower side of the barrier layer (30a) in the insulating layers (31-34). After that, on the main body layer (30b), for example, a silicon oxide film or a silicon nitride film is formed as the barrier layer (30a) by sputtering. On the barrier layer (30a), by performing lamination and thermocompression bonding of a film-like resin for the second time, the main body layer (30b) on the upper side of the barrier layer (30a) is formed.

With reference to FIGS. 9A-9D, a method for manufacturing the wiring substrate of the second embodiment is described using a case where the wiring substrate 10 illustrated in FIGS. 7 and 8 is manufactured as an example. As described above, the wiring substrate of the second embodiment mainly differs from the wiring substrate of the first embodiment illustrated in FIG. 1 only in the structure of the conductor layers (22-25). Therefore, a method for forming the conductor layers (22-25) (a method for forming the conductor layer 22 representing the conductor layers) is mainly described.

Figure 9A:
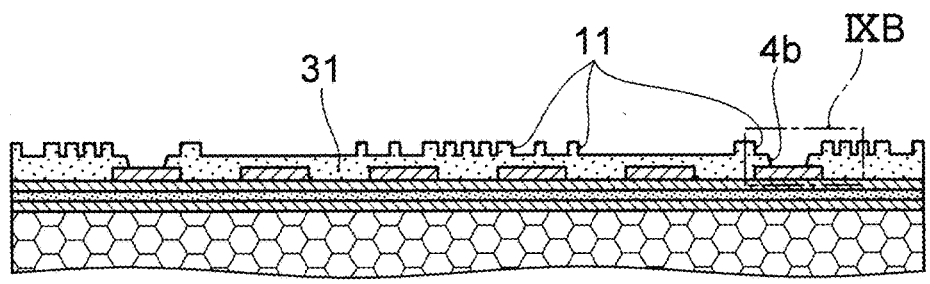
FIG. 9A is a cross-sectional view illustrating an example of a manufacturing process of a wiring substrate according to an embodiment of the present invention.

As illustrated in FIG. 9A, from the state illustrated in FIG. 5A referenced above, the insulating layer 31 is formed, the through holes (4b) are formed in the insulating layer 31, and further, the recesses 11 are formed. At the stage illustrated in FIG. 9A, the insulating layer 31 may be formed to have a thickness larger than the desired thickness of the insulating layer 31 when the wiring substrate 10 is completed. In the formation of the insulating layer 31, the barrier layer (30a) (see FIG. 8) may be formed using a method described above. The through holes (4b) are formed at formation positions of the via conductors 4 (see FIG. 7), for example, by $CO_2$ laser irradiation or the like. When the barrier layer (30a) is formed, the through holes (4b) are formed to penetrate the barrier layer (30a) to reach the conductor layer 21.

After the formation of the through holes (4b), the recesses 11 are formed at formation positions of the conductor patterns of the conductor layer 22 (see FIG. 7). For example, the recesses 11 having a predetermined depth are formed by excimer laser irradiation. When the barrier layer (30a) illustrated in FIG. 8 is formed, since the barrier layer (30a) prevents laser transmission, it may be possible that the recesses 11 of a desired depth can be easily formed. Even when the barrier layer (30a) is not formed, as described above, for example, by adjusting a condition of the excimer laser, or the like, the recesses 11 having a desired depth can be formed. After the formation of the recesses 11, preferably, a desmear treatment such as a plasma treatment is performed.

Figure 9B:
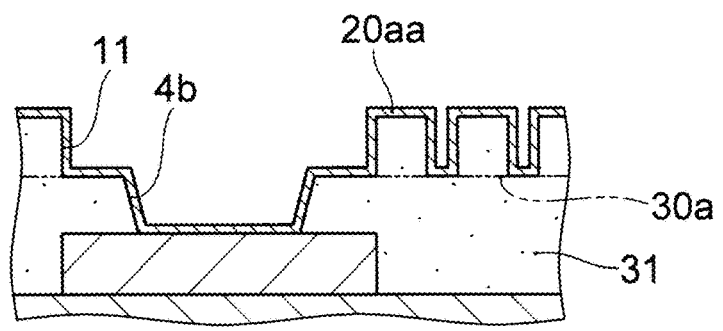
FIG. 9B is a cross-sectional view illustrating an example of a manufacturing process of a wiring substrate according to an embodiment of the present invention.

As illustrated in FIG. 9B, the metal film (20aa) is formed on the entire exposed surface of the insulating layer 31 including inner sides of the through holes (4b) and the recesses 11. FIG. 9B is an enlarged view of a portion (IXB) illustrated in FIG. 9A after the formation of the metal film (20aa). When the barrier layer (30a) indicated with a two-dot chain line in FIG. 9B is formed, the metal film (20aa) is also formed on the exposed surface of the barrier layer (30a). The metal film (20aa) is formed, for example, by sputtering or electroless plating.

Figure 9C:
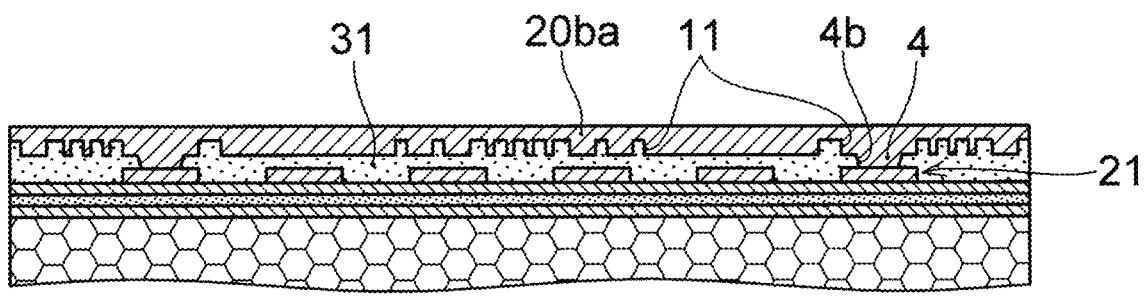
FIG. 9C is a cross-sectional view illustrating an example of a manufacturing process of a wiring substrate according to an embodiment of the present invention.

As illustrated in FIG. 9C, the metal film (20ba) is formed in the through holes (4b), in the recesses 11, and on the entire surface (upper surface) of the insulating layer 31 on the opposite side with respect to the conductor layer 21. The metal film (20ba) is preferably formed to have a desired thickness in a region on the upper surface of the insulating layer 31 where the recesses 11 are not formed. The metal film (20ba) is formed, for example, by electrolytic plating using the metal film (20aa) (see FIG. 9B) as a power feeding layer. The recesses 11 are filled with the metal film (20ba). The through holes (4b) are also filled with the metal film (20ba) to form the via conductors 4.

Figure 9D:
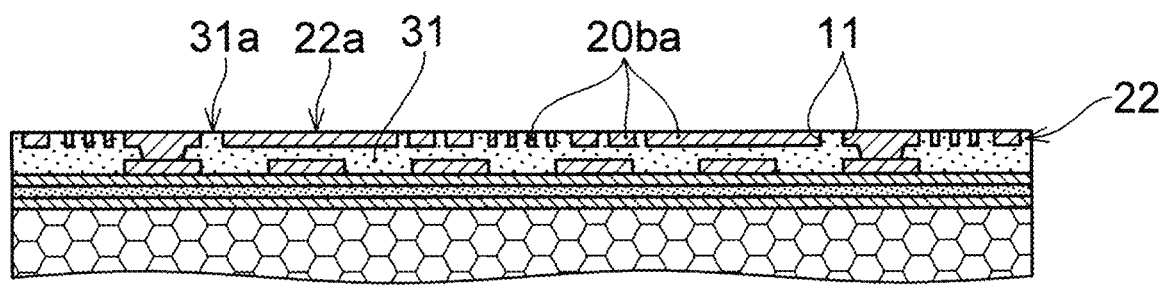
FIG. 9D is a cross-sectional view illustrating an example of a manufacturing process of a wiring substrate according to an embodiment of the present invention.

As illustrated in FIG. 9D, the metal film (20ba) and the metal film (20aa) on the upper surface of the insulating layer 31 (see FIG. 9B) are removed, for example, by polishing using any method such as CMP. The metal film (20ba) is polished until a total thickness of the metal film (20aa) on the bottom surfaces of the recesses 11 and the metal film (20ba) reaches a thickness required for the conductor layer 22. When the polishing of the metal film (20ba) is performed, an upper surface portion of the insulating layer 31 also may be removed by polishing together with the metal film (20ba). The surface (31a) of the insulating layer 31 flush with the surface (22a) of the conductor layer 22 is obtained.

By removing the metal film (20ba) and metal film (20aa) on the upper surface of the insulating layer 31 (see FIG. 9B), the conductor patterns of the conductor layer 22 are separated from each other. The conductor layer 22 including desired conductor patterns and having a desired thickness is obtained. In the method described with reference to FIGS. 9A-9D, a conductor such as the metal film (20aa) formed between the conductor patterns included in the conductor layer 22 can be more reliably removed by polishing rather than etching. Therefore, it is thought that a short circuit failure between the conductor patterns is unlikely to occur. Further, since a short circuit failure is unlikely to occur, wiring patterns can be formed at an even finer pitch.

After that, using the same method as described with reference to FIGS. 9A-9D, the insulating layers (32-34) and the conductor layers (23-25) (see FIG. 7) are alternately formed. After that, using the method described above with reference to FIGS. 5G-5J, the insulating layer 35, the conductor posts 5, and the functional layer 6 are formed. Further, using the method described with reference to FIG. 5K, the support 8 and the second metal film layer 84 are removed. Through the above processes, the wiring substrate 10 in the example of FIG. 7 is completed.

The wiring substrate of the embodiment is not limited to those having the structures illustrated in the drawings and those having the structures, shapes, and materials exemplified herein. As described above, the wiring substrate of the embodiment can include any number of conductor layers and insulating layers. Wiring patterns (first wiring patterns) that connect conductor pads on which mounting components are mounted can be formed in one or more conductor layers. The conductor posts 5 and the functional layer 6 included in the wiring substrate 1 and the wiring substrate 10 illustrated in FIG. 1 or FIG. 7 are not necessarily included in the wiring substrate of the embodiment. The support 8 illustrated in FIG. 4 and the like does not necessarily have the structure illustrated in FIG. 4 and the like. The support 8 is not particularly limited in structure or material as long as the support 8 can support the conductor layers and the insulating layers included in the wiring substrate of the embodiment with required stability at least during a manufacturing process, and can be intentionally removed at a desired time.

Japanese Patent Application Laid-Open Publication No. 2014-78634 describes a printed wiring board including laminated multiple resin insulating layers, conductor layers that are respectively formed on the multiple resin insulating layers, and via conductors connecting the conductor layers. Multiple pads formed by exposed surfaces of an uppermost conductor layer and exposed surfaces of a lowermost conductor layer are connected to an integrated circuit (IC) chip or a motherboard.

In the printed wiring board described in Japanese Patent Application Laid-Open Publication No. 2014-78634, it may not be possible to provide fine wirings corresponding to electrodes of an electronic component such as an IC chip to be connected to the printed wiring board, or signal lines with sufficient transmission characteristics for high-frequency signals transmitted between electronic components. Further, it may be possible that a suitable surface condition for the pads cannot be obtained, a sufficient connection quality between an external element such as an electronic component and the printed wiring board cannot be obtained, and transmission quality further degrades.

A wiring substrate according to an embodiment of the present invention has a first surface and a second surface on the opposite side with respect to the first surface and includes: alternately laminated multiple conductor layers and multiple insulating layers; and via conductors that connect the multiple conductor layers by each penetrating one of the multiple insulating layers. Among the multiple conductor layers, an outermost conductor layer on the first surface side includes first conductor pads on which a first component is mounted and second conductor pads on which a second component is mounted. The multiple conductor layers include a first conductor layer that includes first wiring patterns connecting the first conductor pads and the second conductor pads. A surface of the first conductor layer on the first surface side is a polished surface. Wiring patterns included in the first conductor layer have a minimum wiring width of 3 µm or less. The wiring patterns included in the first conductor layer have a minimum inter-wiring distance of 3 µm or less. The wiring patterns have an aspect ratio of 2.0 or more and 4.0 or less.

According to an embodiment of the present invention, in the wiring substrate to be connected to components, it may be possible that fine transmission paths with excellent signal transmission characteristics can be provided and quality of the connection to the components can be improved.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
a plurality of insulating layers;
a plurality of conductor layers formed on the plurality of insulating layers; and
a plurality of via conductors formed in the plurality of insulating layers such that the plurality of via conductors is connecting the plurality of conductor layers through the plurality of insulating layers,
wherein the plurality of conductor layers includes a first conductor layer and an outermost conductor layer formed such that the outermost conductor layer includes a plurality of first conductor pads positioned to mount a first component and a plurality of second conductor pads positioned to mount a second component and that the first conductor layer includes a plurality of wiring patterns including a plurality of first wiring patterns connecting the first conductor pads and the second conductor pads, the first conductor layer in the plurality of conductor layers is formed such that the plurality of wiring patterns has a minimum wiring width of 3 µm or less, a minimum inter-wiring distance of 3 µm or less and an aspect ratio in a range of 2.0 to 4.0, the plurality of via conductors includes a plurality of stacked via conductors, and the plurality of conductor layers includes a second outermost conductor layer on an opposite side with respect to the outermost conductor layer such that the second outermost conductor layer includes a plurality of third conductor pads positioned to connect a plurality of external conductors and that at least one of the plurality of first conductor pads and the plurality of second conductor pads is connected to the plurality of third conductor pads via the plurality of stacked via conductors.

2. The wiring substrate according to claim 1, wherein the first conductor layer in the plurality of conductor layers is formed such that the plurality of first wiring patterns has a wiring width of 3 μm or less and an inter-wiring distance of 3 μm or less and that the plurality of first wiring patterns has an aspect ratio in a range of 2.0 to 4.0.

3. The wiring substrate according to claim 2, wherein the first conductor layer in the plurality of conductor layers is formed such that the plurality of first wiring patterns has a thickness of 7 μm or less.

4. The wiring substrate according to claim 2, wherein the plurality of via conductors has an aspect ratio in a range of 0.5 to 1.0.

5. The wiring substrate according to claim 1, wherein the plurality of via conductors has an aspect ratio in a range of 0.5 to 1.0.

6. The wiring substrate according to claim 1, wherein the first conductor layer in the plurality of conductor layers includes a conductor layer comprising a sputtering film and a metal film formed on the sputtering film.

7. The wiring substrate according to claim 1, wherein the plurality of insulating layers includes an insulating layer formed such that the insulating layer has a plurality of recesses on a surface, and the plurality of conductor layers include a conductor layer formed in the plurality of recesses.

8. The wiring substrate according to claim 1, wherein the plurality of conductor layers is formed such that each of the conductor layers except the second outermost conductor layer includes a plurality of wiring patterns having a wiring width of 3 μm or less, an aspect ratio in a range of 2.0 to 4.0, and an inter-wiring distance of 3 μm or less.

9. The wiring substrate according to claim 1, further comprising:
a support adhered to a surface of a structure comprising the plurality of insulating layer, the plurality of conductor layers and the plurality of via conductor layers such that the support is adhered to the surface of the structure on an opposite side with respect to the outermost conductor layer.

10. The wiring substrate according to claim 1, wherein the first conductor layer in the plurality of conductor layers is formed such that the first conductor layer has a polished surface on an outermost conductor layer side.

11. The wiring substrate according to claim 10, wherein the first conductor layer in the plurality of conductor layers is formed such that the plurality of first wiring patterns has a wiring width of 3 μm or less and an inter-wiring distance of 3 μm or less and that the plurality of first wiring patterns has an aspect ratio in a range of 2.0 to 4.0.

12. The wiring substrate according to claim 11, wherein the first conductor layer in the plurality of conductor layers is formed such that the plurality of first wiring patterns has a thickness of 7 μm or less.

13. The wiring substrate according to claim 12, wherein the polished surface of the first conductor layer has an arithmetic mean roughness of 0.3 μm or less.

14. The wiring substrate according to claim 11, wherein the polished surface of the first conductor layer has an arithmetic mean roughness of 0.3 μm or less.

15. The wiring substrate according to claim 10, wherein the plurality of via conductors has an aspect ratio in a range of 0.5 to 1.0.

16. The wiring substrate according to claim 10, wherein the first conductor layer in the plurality of conductor layers includes a conductor layer comprising a sputtering film and a metal film formed on the sputtering film.

17. The wiring substrate according to claim 10, wherein the plurality of insulating layers includes an insulating layer formed such that the insulating layer has a plurality of recesses on a surface, and the first conductor layer in the plurality of conductor layers include a conductor layer formed in the plurality of recesses such that the first conductor layer has a polished surface exposed on the surface of the insulating layer.

18. The wiring substrate according to claim 10, wherein the plurality of conductor layers is formed such that each of the conductor layers except the second outermost conductor layer has a polished surface on an outermost conductor layer side and includes a plurality of wiring patterns having a wiring width of 3 μm or less, an aspect ratio in a range of 2.0 to 4.0, and an inter-wiring distance of 3 μm or less.

19. The wiring substrate according to claim 10, further comprising:
a support adhered to a surface of a structure comprising the plurality of insulating layer, the plurality of conductor layers and the plurality of via conductor layers such that the support is adhered to the surface of the structure on an opposite side with respect to the outermost conductor layer.

20. The wiring substrate according to claim 10, wherein the polished surface of the first conductor layer has an arithmetic mean roughness of 0.3 μm or less.

* * * * *

UNITED STATES PATENT AND TRADEMARK OFFICE
CERTIFICATE OF CORRECTION

PATENT NO. : 12,388,025 B2
APPLICATION NO. : 18/351520
DATED : August 12, 2025
INVENTOR(S) : Toshiki Furutani and Masashi Kuwabara Page 1 of 1

It is certified that error appears in the above-identified patent and that said Letters Patent is hereby corrected as shown below:

In the Claims

Claim 9, Column 21, Line 38, "layer," should read as --layers,--.

Claim 19, Column 22, Line 40, "layer," should read as --layers,--.

Signed and Sealed this
Fourth Day of November, 2025

John A. Squires
*Director of the United States Patent and Trademark Office*